(12) United States Patent
Ikeda

(10) Patent No.: US 7,449,932 B2
(45) Date of Patent: Nov. 11, 2008

(54) PULSE GENERATING CIRCUIT, ELECTRONIC DEVICE USING THIS PULSE GENERATING CIRCUIT, CELLULAR PHONE SET, PERSONAL COMPUTER, AND INFORMATION TRANSMITTING METHOD USING THIS CIRCUIT

(75) Inventor: Masayuki Ikeda, Shiojiri (JP)

(73) Assignee: Seiko Epson Corporation (JP)

( * ) Notice: Subject to any disclaimer, the term of this patent is extended or adjusted under 35 U.S.C. 154(b) by 20 days.

(21) Appl. No.: 11/531,031

(22) Filed: Sep. 12, 2006

(65) Prior Publication Data
US 2007/0058769 A1   Mar. 15, 2007

(30) Foreign Application Priority Data

| | | | |
|---|---|---|---|
| Sep. 13, 2005 | (JP) | ............................. | 2005-265359 |
| Jan. 26, 2006 | (JP) | ............................. | 2006-017495 |
| Jun. 22, 2006 | (JP) | ............................. | 2006-172463 |

(51) Int. Cl.
*G06F 1/04* (2006.01)

(52) U.S. Cl. ...................................... 327/291; 327/172

(58) Field of Classification Search ....................... None
See application file for complete search history.

(56) References Cited

U.S. PATENT DOCUMENTS

| | | | |
|---|---|---|---|
| 6,037,812 A | * | 3/2000 | Gaudet ........................ 327/116 |
| 6,421,389 B1 | | 7/2002 | Jett |
| 2001/0033576 A1 | | 10/2001 | Richards |
| 2003/0108133 A1 | | 6/2003 | Richards |

OTHER PUBLICATIONS

T. Terada, S. Yoshizumi, Y. Sanada, T. Kuroda; A CMOS Impulse Radio Ultra-Wideband Transceiver for 1 Mb/s Data Communications and ±2.5 cm Range Findings, 2005 Symposium on VLSI Circuits Digest of Technical Papers.

* cited by examiner

*Primary Examiner*—Cassandra Cox
(74) *Attorney, Agent, or Firm*—Harness, Dickey & Pierce, P.L.C.

(57) ABSTRACT

A pulse generating circuit includes a plurality of delay elements cascaded so as to constitute a predetermined loop, wherein when a predetermined input pulse is supplied to a leading end of the series connection, an effective frequency multiplication is applied to signals which appear at a plurality of portions out of the node portions among the plurality of delay elements and the terminal end portion of the series connection by a logical circuit to obtain an output pulse having a higher frequency than the input pulse.

25 Claims, 18 Drawing Sheets

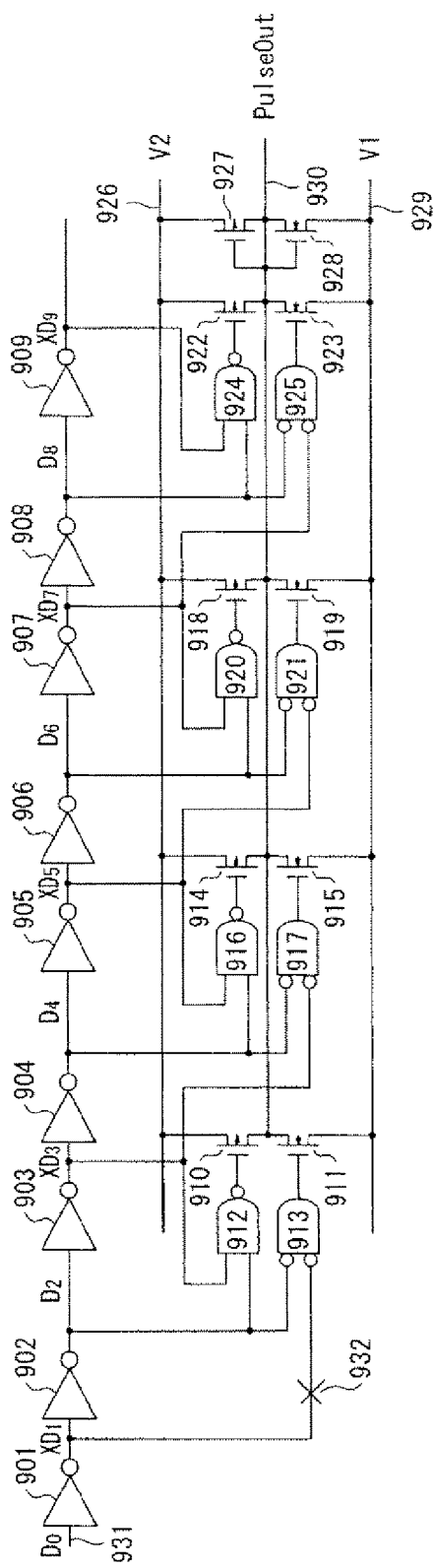
FIG. 9A
FIG. 9B
FIG. 9C

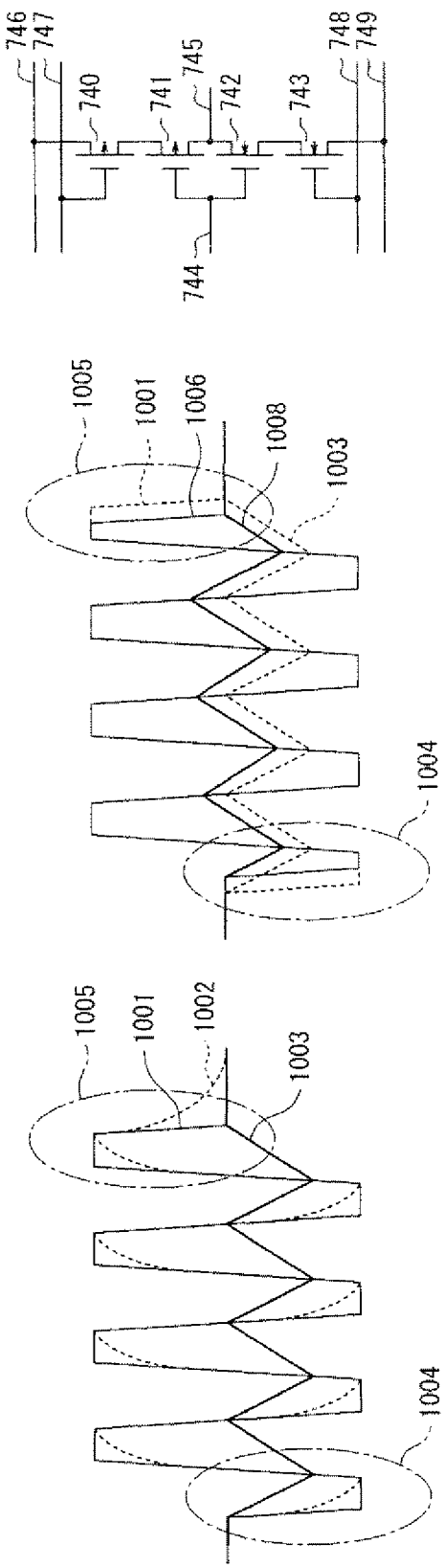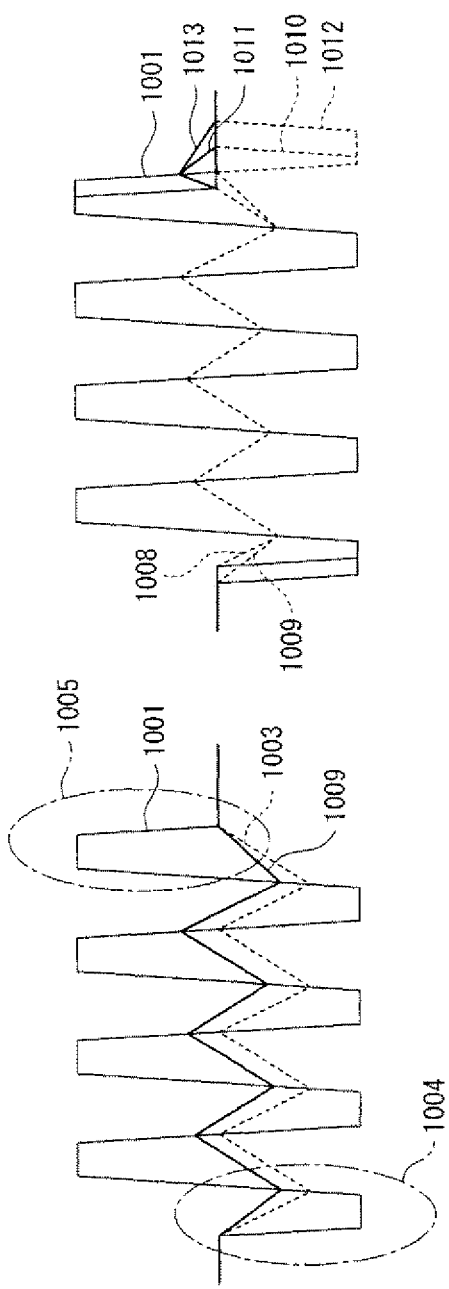

PULSE GENERATING CIRCUIT, ELECTRONIC DEVICE USING THIS PULSE GENERATING CIRCUIT, CELLULAR PHONE SET, PERSONAL COMPUTER, AND INFORMATION TRANSMITTING METHOD USING THIS CIRCUIT

BACKGROUND

1. Technical Field

The present invention relates to a pulse generating circuit, suitable for an UWB (Ultra Wide Band), an electronic device using this circuit, and a method of transmitting information using this circuit.

2. Related Art

UWB communication is a communication system for performing high-speed and high-capacity data communication using a very wide frequency band. A communication system using a wideband signal includes a method using a spread spectrum and a method of orthogonal frequency division multiplex (OFDM) in the related art. However, UWB is a communication system of a wider band using very short pulses, and is also referred to as a communication of an impulse radio (IR) system. In the IR system, modulation and demodulation are possible only by operating a time axis which does not depend on modulation in the related art, and it is considered that simplification of the circuit or reduction of power consumption can be expected (see U.S. Pat. No. 6,421,389, Pub. No.: US2003/0108133A1, and Pub. No.: US2001/0033576).

A pulse waveform used in the IR system will now be described. A pulse train having a pulse width $P_D$ and a cycle $T_P$ as shown in FIG. 16A is well known and the frequency spectrum of the pulse train is a sinc function whose envelope has a first zero point at a frequency of $BW=1/P_D$ as shown in FIG. 16B.

It is not easy to use such a pulse since the spectrum spreads from a direct current to BW, and hence a pulse whose center frequency f of the spectrum is at a high position as shown in FIG. 17B is preferred.

In other words, it has a pulse waveform as shown in FIG. 17A and is obtained by multiplying the pulse in FIG. 17A by the square wave of $f_0=½P_W$ to move the frequency spectrum toward the higher side. However, this waveform contains a direct current (DC) component as shown by a chain line 1701 in FIG. 17A and, precisely speaking, does not have a spectrum as shown in FIG. 17B. Various pulse waveforms which are ideal for the UWB communication other than this waveform are devised and are different from the waveform shown here. However, the waveform shown here is in heavy usage since the method of generation it is easy.

FIG. 18A shows an example of a circuit in the related art for generating the pulse as shown in FIG. 17A (A CMOS IMPULSE RADIO ULTRA-WIDEBAND TRANSCEIVER FOR 1 Mb/s DATA COMMUNICATION AND ±2.5 cm RANGE FINDINGS T. Terada et. al, 2005 Symposium on VLSI Circuits Digest of Technical Papers, pp. 30-33).

As shown in the drawing, two inverters 1801, 1802 and an NOR circuit 1803 constitute a ring oscillator of three stages when another input C of the NOR 1803 is false (L: low level) In other words, C oscillates for the period of L and change of outputs NR1, N1, N2 of the NOR 1803 and inverters 1801, 1802 is propagated by a delay of time t respectively as shown in a time chart in FIG. 18B. For simplification, it is assumed that the rising time and the dropping time of the NOR 1803 and the inverters 1801 and 1802 are all the same. Therefore, the pulse width (Pw in FIG. 17A) generated in this circuit is 3 t. In other words, three times the delay time of an element which constitutes the circuit is the shortest possible pulse width.

However, when an attempt is made to obtain a pulse of a required high frequency band by the pulse generating circuit in the related art as described above, an element having a sufficient speed must be used. However, in fact, it is very difficult or impossible to obtain such an element.

Generally, when an attempt is made to operate the element at a high speed, an increase in power consumption results. Therefore, when an attempt is made to obtain a very short pulse in such a circuit, an increase in power consumption is inevitable in the related art. In addition, reduction of power consumption is also strongly desired in a case in which transmission of a signal is desired to be carried out wirelessly in a very short distance as in the case between a plurality of housings divided and connected so as to be capable of relative displacement in terms of posture and position, or in the same housing.

SUMMARY

Accordingly, an advantage of some aspects of the invention is to provide a pulse generating circuit that is capable of easily generating a high-frequency band pulse, simple in structure and that consumes little power, an electronic device using this circuit, and a method of transmitting information using this circuit.

In a pulse generating circuit according to an aspect of the invention a plurality of delay elements are cascaded so as to constitute a predetermined loop and, when a predetermined input pulse is supplied to a leading end of the series connection, an effective frequency multiplication is applied to signals which appear at a plurality of portions out of the node portions among the plurality of delay elements and the terminal end portion of the series connection by a logical circuit to obtain an output pulse having a higher frequency than the input pulse.

In this pulse generating circuits a pulse output of a predetermined frequency can be obtained by a plurality of cascaded delay elements so as to constitute a predetermined loop, and an effective frequency multiplication is applied to a signal in which the pulse output is obtained at a predetermined plurality of portions out of the node portions among the plurality of delay elements and the terminal end portion of the series connection by the logical circuit to obtain a desired high-frequency output pulse.

A pulse generating circuit according to an aspect of the invention includes delay circuits cascaded by a predetermined number of stages, a plurality of first logical circuits that are connected to outputs of the delay circuits and generate pulses having a time width which corresponds to the amount of delay per delay circuit, and a second logical circuit which takes the logical sum of outputs from the first logical circuits.

Accordingly, a plurality of amounts of delay of the delay circuits can be extracted and combined by the logical circuit, and hence the pulse width of the generated pulse can be reduced to the amount of delay of the delay circuit. In the related art, three times the amount of delay of the delay circuit is the smallest possible pulse width. Therefore, a significant improvement can be achieved. The delay circuit can be configured by a buffer circuit or the like of the semiconductor element and, when an element which is high in speed of response is used, the pulse width can be reduced to the delay time of the element when it is operated at the maximum speed.

A pulse generating circuit according to an aspect of the invention includes a delay circuit formed by cascading buffer circuits whose amount of delay can be electrically controlled by predetermined stages, a plurality of first logical circuits which are connected to outputs of the delay circuit and generate pulses having a time width corresponding to the amount of delay per delay circuit, a second logical circuit which takes a logical sum of the outputs of the first logical circuits, a comparator circuit for comparing the amount of delay of the delay circuit and the reference amount of delay, and a circuit for controlling the amount of delay of the buffer circuit by an output from the comparator circuit.

Accordingly, since the delay circuit can be realized by the simple series connection of the buffer circuits, it can be easily implemented. In addition, since the amount of delay thereof is controlled by being compared with the reference amount of delay, pulses with a high level of accuracy can be generated. In particular, the problems relating to manufacture such as variations depending on the semiconductor manufacturing process can be solved easily.

A pulse generating circuit according to an aspect of the invention includes a delay circuit formed by cascading first buffer circuits whose amount of delay can be electrically controlled by predetermined stages, a plurality of first logical circuits which are connected to outputs of the delay circuits and generate pulses having a time width corresponding to the amount of delay per delay circuit, a second logical circuit that takes a logical sum of the outputs of the first logical circuits, an oscillation circuit having a second buffer circuit having similar electric characteristics to the first buffer circuit, and a phase-locked loop having the oscillation circuit for feedback-controlling the amount of delay of the second buffer circuit so that the oscillation frequency of the oscillation circuit is phase-locked to a reference frequency by comparing the output of the oscillation circuit and the reference frequency, and the amount of delay of the first buffer circuit is controlled identically with the feedback-control of the phase-locked loop.

Accordingly, since the delay circuit can be realized by the simple series connection of the buffer circuits, it can be implemented easily. In addition, since the amount of delay thereof is controlled on the basis of the result of comparison with the oscillation frequency of the oscillation circuit using the equivalent element as those configuring the delay circuit and the reference frequency, pulses with a high degree of accuracy can be generated easily. In particular, the problems relating to manufacture such as variations depending on the semiconductor manufacturing process can be solved easily.

A pulse generating circuit according to an aspect of the invention includes a delay circuit formed by cascading buffer circuits whose amount of delay can be electrically controlled by predetermined stages, a plurality of first logical circuits which are connected to outputs of the delay circuits and generate pulses having a time width corresponding to the amount of delay per delay circuit, a second logical circuit which takes a logical sum of the outputs of the first logical circuits, a switching unit that connects an output of the buffer circuit of a predetermined stage in the delay circuit and the input of the delay circuit for forming a ring oscillation circuit, a phase-locked loop including the ring oscillation circuit, a unit for holding a signal when the phase-locked loop is locked to the reference frequency as a control signal for the amount of delay of the buffer circuit, wherein the operating timings of the first and second logical circuits are set to a time point when the phase-locked loop is released and the amount of delay of the buffer circuit is controlled to be equivalent to the amount of delay when the phase-locked loop is locked Accordingly, since the amount of delay of the buffer circuit which constitutes the pulse generating circuit is used for pulse generation by forming the phase-locked loop by switching the buffer circuit, and holding the control voltage when the phase-locked loop is locked, accurate pulse generation is enabled.

A pulse generating circuit according to an aspect of the invention includes an oscillation circuit formed by connecting delay circuits arranged in a plurality of stages and a gate circuit in a loop shape, a plurality of first logical circuits that generate pulses having a time width corresponding to the amount of delay of each stage from outputs from the respective stages of the oscillation circuit, and a second logical circuit that takes a logical sum of the outputs of the first logical circuits.

Accordingly, the oscillation of the ring oscillation circuit can be controlled by the gate circuit to extract pulse trains corresponding to the amounts of delay of the respective stages by the first and second logical circuits while the oscillation circuit oscillates, so that a fine pulse train can be generated. In addition, since the pulses can be generated continuously while the oscillation circuit keeps oscillating, a pulse train having a large number of fingers can be generated without increasing the number of elements of the circuit.

It is preferable that the amount of delay of the delay circuit can be controlled, and the amount of delay is controlled to be a predetermined value.

Accordingly, since the amount of delay of the delay circuit can be controlled, pulses having an intended predetermined pulse width can be obtained easily.

A pulse generating circuit according to an aspect of the invention includes an oscillation circuit formed by connecting a plurality of buffer circuit whose amount of delay can be electrically controlled and a gate circuit in a loop shape, a plurality of first logical circuits that generate pulses having a time width corresponding to the amount of delay of each stage from outputs from the respective stages of the oscillation circuit, a second logical circuit that takes a logical sum of the outputs of the first logical circuits, a comparator circuit for comparing the amounts of delay of the respective stages and the reference amount of delay, and a circuit for controlling the amount of delay of the buffer circuit on the basis of an output from the comparator circuit.

Accordingly, since the oscillation circuit can be realized by the simple series connection of the buffer circuits, it can be implemented easily. In addition, since the amount of delay is controlled by being compared with the reference delay time, pulses with a high degree of accuracy can be generated. The problems relating to manufacture such as variations depending on the semiconductor manufacturing process can be solved easily. In addition, since the pulses can be generated continuously while the oscillation circuit keeps oscillating, a pulse train having a large number of fingers can be generated without increasing the number of elements of the circuit.

A pulse generating circuit according to an aspect of the invention includes an oscillation circuit formed by connecting a plurality of first buffer circuit whose amount of delay can be electrically controlled and a gate circuit in a loop shape, a plurality of first logical circuits that generate pulses having a time width corresponding to the amount of delay of each stage from outputs from the respective stages of the oscillation circuit, a second logical circuit that takes a logical sum of the outputs of the first logical circuits, and an oscillation circuit having a second buffer circuit having similar electric characteristics to the first buffer circuit, and a phase-locked loop having the oscillation circuit for feedback-controlling the amount of delay of the second buffer circuit so that the oscillation frequency of the oscillation circuit is phase-locked to a reference frequency by comparing the output of the oscillation circuit and the reference frequency, and the amount of delay of the first buffer circuit is controlled identically with the feedback-control of the phase-locked loop.

Accordingly, since the oscillation circuit can be realized by the simple series connection of the buffer circuits, it can be implemented easily. In addition, since the amount of delay thereof is controlled by the comparison with the reference delay time, pulses with a high degree of accuracy can be generated easily. The problems relating to manufacture such as variations depending on the semiconductor manufacturing process can be solved easily. In addition, since the pulses can be generated continuously while the oscillation circuit keeps oscillating, a pulse train having a large number of fingers can be generated without increasing the number of elements of the circuit.

It is preferable that the controllable buffer circuit includes a CMOS inverter and a unit for controlling a current flowing into the CMOS inverter.

Accordingly, since control of the delay time can be realized by a simple MOS circuit, it can be implemented easily.

It is preferable that the controllable buffer circuit is a buffer circuit having a CMOS current mode logic circuit, and the amount of delay can be varied by the control of the current flowing into the buffer circuit, Accordingly, since the delay circuit is configured with the CMOS current mode logic circuit, the operation at the maximum speed of the CMOS circuit can be achieved without a significant increase in the operating power.

It is preferable that the first and second logical circuits include a CMOS current mode logic circuit.

Accordingly, since the logical circuit is configured with the CMOS current mode logic circuit, the operation at the maximum speed of the CMOS circuit can be achieved without a significant increase in the operating power. In addition, the generation of a signal having an amplitude that is as low as being capable of use for a normal UWB communication can easily be achieved.

A pulse generating circuit according to an aspect of the invention includes delay circuits cascaded in N+1 stages (N is a positive integer), a first AND circuit which takes a logical multiple of an output $D_i$ of a delay circuit in the $i^{th}$ (i is an even number of $2 \leq i \leq N$) stage and a negative logic $XD_{i-1}$ of an output of the delay circuit in the i–$1^{th}$ stage, a second AND circuit which takes a logical multiple of a negative logic $XD_i$ of the output $D_i$ of the delay circuit in the $i^{th}$ stage and a logical multiple of the output $D_{i+1}$ of the output of the delay circuit in the i+1 stage, and a switching unit for connecting to a first potential level when an output from the first AND circuit is true, to a second potential level when the second AND circuit is true, and to a third potential level in other cases.

According to the configuration of an aspect of the invention as described above, pulses having a width which correspond to the amount of delay per delay circuit are generated by the logical multiple of the output of the $i^{th}$ ($2 \leq i \leq N$) stage of the delay circuits cascaded in N+1 stages (N is an integer) and negative of the previous output to connect alternately to the first potential level and the second potential level at every pulse width period, and when the output from the AND circuit is not true, connection to the third potential level is achieved. Therefore, pulses having no DC component can be generated. In addition, since the circuit is not associated with an analogue circuit which treats small signals, implementation with a logical circuit configured with the simple CMOS semiconductor integrated circuit is enabled, and hence reduction of power consumption or reduction of cost can be achieved easily.

It is preferable that the amount of delay of the delay circuit can be controlled, and the amount of delay is controlled to be a predetermined value.

According to the configuration as described above in an aspect of the invention, the amount of delay of the delay circuit can be controlled for each stage, whereby a pulse train having an intended predetermined pulse width can be obtained.

It is preferable that the delay circuit includes N+1 stages of MOS inverters and a unit for controlling a source current flowing into the inverters, and amount of delay of the delay circuit is controlled to be a predetermined value by the control of the source current.

According to the configuration described above in an aspect of the invention, since the delay circuit can be configured with the simple MOS inverters, and the amount of delay can be controlled easily by the control of the source current flowing into the inverters, the configuration is simple and the amount of delay of the delay circuit can be set to a predetermined value easily.

It is preferable that the first or second AND circuit includes a unit for controlling the output signals so as to prevent transition durations thereof from overlapping each other.

According to the configuration as described above in an aspect of the invention, since the switching unit is controlled so as to prevent the transition periods of the output signals of the AND circuit from overlapping each other, short circuiting between the first and second potential levels by the switching unit is avoided, so that useless flow of a current into a circuit, so-called, short current can be reduced, which is very effective for reduction of power consumption of the circuit.

It is preferable that an AND circuit that takes a logical multiple of an output $D_2$ of the delay circuit in the second stage and a negative logic $XD_1$ of the output of the delay circuit in the first stage out of the first AND circuits and an AND circuit that takes a logical multiple of a negative logic $XD_N$ of an output $D_N$ of the delay circuit in the $N^{th}$ stage and an output $D_{N+1}$ of the delay circuit in the N+$1^{th}$ stage out of the second AND circuits are provided with a unit for setting the time period during which the output thereof becomes true to be shorter than others.

According to the above-described configuration in an aspect of the invention, the time period being connected to the first or second potential levels can be set to a short period at a front edge and a rear edge of an output pulse. Accordingly, a preferable signal waveform can be outputted even when a load in the output circuit of the signal, in particular, a capacitive load is heavy.

It is preferable that the switching unit controlled by the AND circuit that takes a logical multiple of an output $D_2$ of the delay circuit in the second stage and a negative logic $XD_1$ of the output of the delay circuit in the first stage out of the first AND circuits and the AND circuit that takes a logical multiple of a negative logic $XD_N$ of an output $D_N$ of the delay circuit in the Nth stage and an output $DN_{N+1}$ of the delay circuit in the N+$1^{th}$ stage out of the second AND circuits is set to a conductive impedance higher than that for other switching units.

According to the configuration as described above in an aspect of the invention, since the conductive impedance when the switching unit is brought into conduction is set to a larger value at a front edge and a rear edge of the generated pulse in comparison with other portions, a speed of charging and discharging the output load capacity can be controlled. Accordingly, the distortion of the output pulse can be adjusted to obtain a preferable pulse waveform.

It is preferable that the delay circuit in the first stage is omitted, and an input signal to the delay circuit is connected instead of an output signal from the first stage.

According to the configuration as described above in an aspect of the invention, since the first stage of the display circuit can be omitted and hence the number of circuit elements can be reduced, there is a cost savings, and an effect to reduce the power consumption is achieved even though the amount is small. In addition, since the logical circuit configured with the CMOS integrated circuit can be employed according to an aspect of the invention, the CMOS circuit can be operated easily at the maximum speed thereof without an increase in operating power, and hence high-frequency wideband pulses which can be used for the UWB communication can be generated easily.

On the other hand, an electronic device according to an aspect of the invention includes wireless units for wirelessly performing transmission of signals between a plurality of housings being connected by a connecting mechanism member so as to allow relative displacement in terms of posture or position thereof and each including an electronic circuit mounted therein in the respective housing, and the wireless unit is configured by the application of the pulse generating circuit in any one of the various modes described above.

According to the electronic device as described above, since transmission of required information is performed wirelessly between both housings, the connection mechanism member is simplified. In addition, since the wireless unit is configured by the application of the pulse generating circuit in any one of the various modes described above, the size can be reduced, and the effect of reduction of power consumption is significant.

A cellular phone according to an aspect of the invention includes a first and second housings connected by a connecting mechanism member so as to allow the relative displacement in terms of posture and position thereof and each including an electronic circuit mounted therein, and wireless units provided respectively in the first housing and the second housing so as to perform transmission of signals wirelessly between the first housing and the second housing, and the wireless units are configured by the application of the pulse generating circuit in any one of the various modes described above.

The cellular phone configured as described above includes so-called a clamshell type and a rotary type, in which since the transmission of required information between the housings can be performed wirelessly, simplification of the connecting mechanism member is achieved. In addition, since the wireless units are configured by the application of the pulse generating circuit in any one of the various modes as described above, the size can be reduced, and the effect of reduction of power consumption is significant.

Furthermore, a personal computer according to an aspect of the invention includes a first housing and a second housing connected by a connecting mechanism member so as to allow the relative displacement in terms of posture and position thereof and each including an electronic circuit mounted therein, and wireless units provided respectively in the first housing and the second housing so as to perform transmission of signals wirelessly between the first housing and the second housing, and the wireless units are configured by the application of the pulse generating circuit in any one of the various modes described above.

In the personal computer as described above, since the transmission of required information between the housings can be performed wirelessly, simplification of the connecting mechanism member is achieved. In addition, since the wireless units are configured by the application of the pulse generating circuit in any one of the various modes as described above, the size can be reduced, and the effect of reduction of power consumption is significant.

An electronic device according to an aspect of the invention includes at least a pair of wireless units for transmitting signals wirelessly mutually between those selected from a plurality of circuit blocks and circuit substrates mounted in the identical housing, and the corresponding wireless units are electronic devices configured by the application of any one of pulse generating circuits in the various modes described above.

In the electronic device, sending and receiving of the signals can be performed wirelessly using an electromagnetic wave or the like mutually between those selected from a plurality of circuit blocks and circuit substrates, and hence the signals are transmitted by being propagated in the air. Therefore, wiring using a flexible substrate or a connector is not necessary, and hence anxiety such as an increase in cost or lowering in reliability which may be caused thereby is eliminated.

A method of transmitting information according to an aspect of the invention is a method of transmitting information for performing transmission of signals wirelessly between a plurality of housings being connected by a connecting mechanism member so as to allow relative displacement in terms of posture and position and each including an electronic circuit mounted therein and the transmission of the signals wirelessly is performed by the application of the pulse generating circuit in any one of various modes described above.

In the method of transmitting information, since the connecting mechanism member for enabling wireless transmission of the required information between the housings can be simplified, and transmission of the signal by the wireless units is performed by the application of the pulse generating circuit in any one of various modes described above, the effect of reduction of power consumption is significant.

BRIEF DESCRIPTION OF THE DRAWINGS

The invention will be described with reference to the accompanying drawings, wherein like numbers reference like elements.

FIGS. 9A to 9C are circuit diagrams of a pulse generating circuit according to a seventh embodiment of the invention.

FIGS. 10A to 10E illustrate time charts and a circuit diagram for describing the operation of a pulse generating circuit according to an eighth embodiment of the invention.

DESCRIPTION OF EXEMPLARY EMBODIMENTS

Figure 1A:
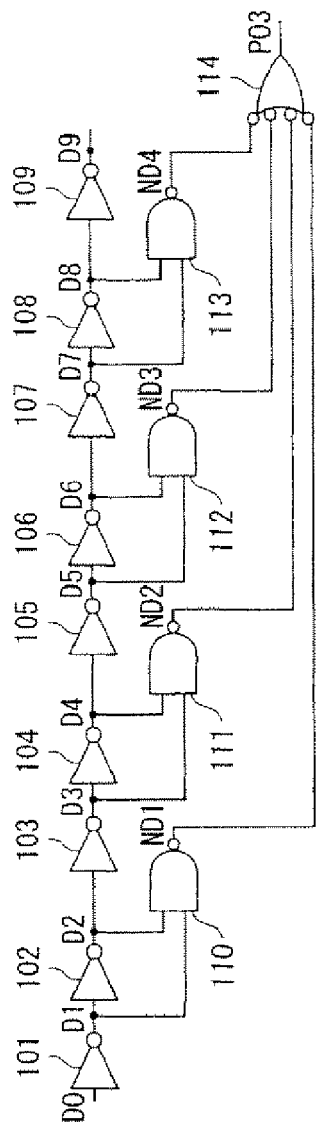
FIGS. 1A to 1D illustrate a circuit diagram of a pulse generating circuit and time charts showing the operation thereof according to a first embodiment of the invention.

Referring now to the drawings, embodiments of the invention will be described.

First Embodiment

Figure 1B:
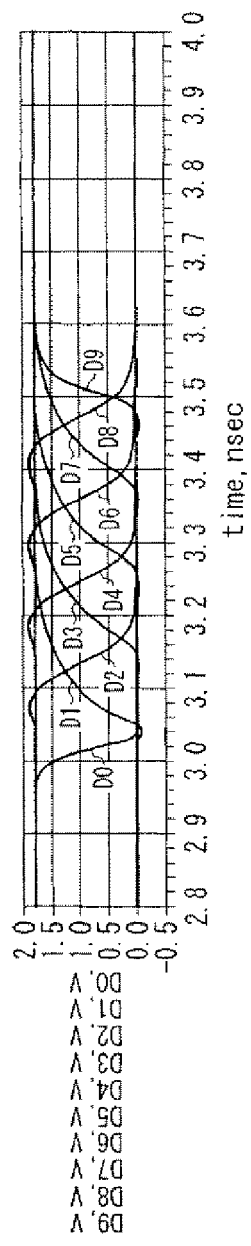
Figure 1C:
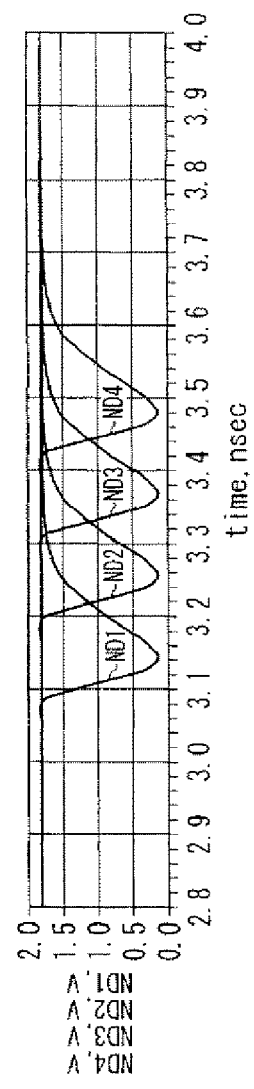
Figure 1D:
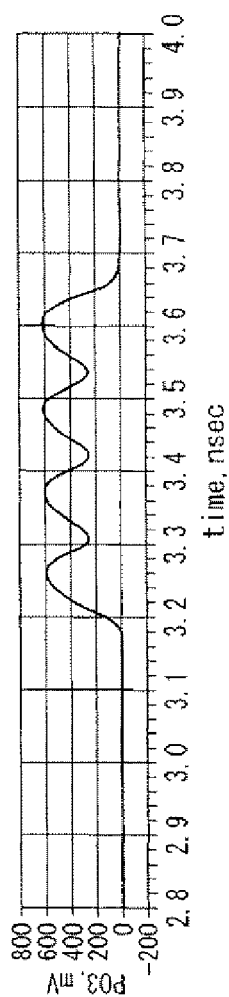
Figure 6A:
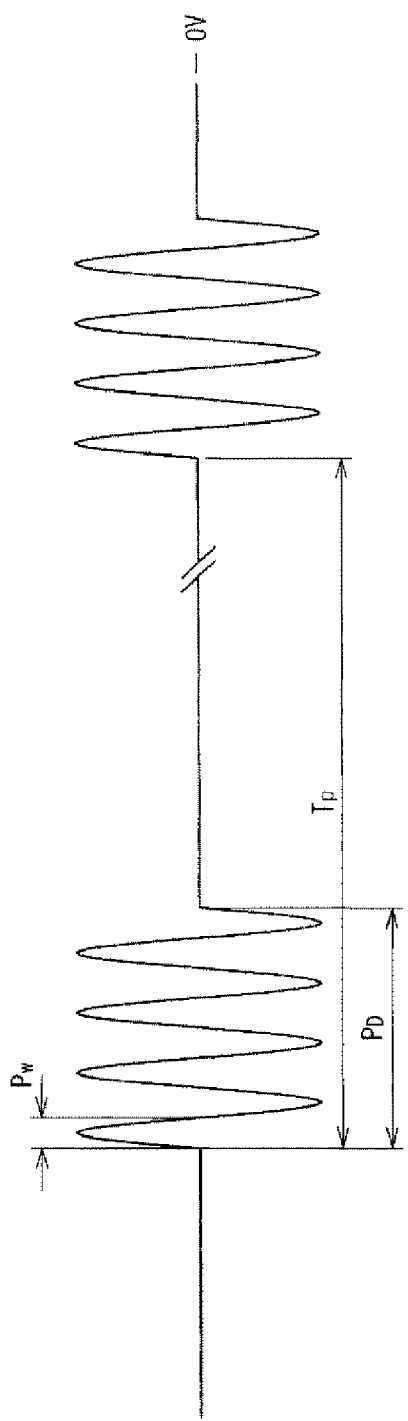
FIGS. 6A and 6B show a pulse waveform to be generated in an aspect of the invention.

FIG. 1A is a circuit diagram showing a principal portion of a pulse generating circuit according to a first embodiment of the invention, FIGS. 1B to 1D are time charts for describing the operation thereof. However, the description will be made of an example in which the pulse waveform assumes a shape as shown in FIG. 6A and four pulses are contained in a time $P_D$ ($P_D=8Pw$) that is, a pulse whose number of fingers is four.

Reference numerals 101 to 109 shown in FIG. 1A are cascaded inverter circuits. The respective input/output terminals are designated by terminal names such as D-0 to D9.

When the input terminal D0 is changed from a high level (H) to a low level (L) as shown in FIG. 1B, the respective outputs are propagated with the delay of t. NOT-AND (NAND) circuits 110 to 113 output L from the terminals ND1 to ND4 as shown in FIG. 1C when both D1 and D2, D3 and D4, D5 and D6, and D7 and D0 are H, respectively. The NEITHER-NOR (NOR) circuit (NOR circuit of negative logic) 114 outputs H as shown in FIG. 1D when at least one of ND1 to ND4 is L. The intended pulse waveform is obtained as described above.

In FIG. 1D, the output level is not scaled out sufficiently. However, a signal strength used for UWB communication is controlled by the law and the level of the normal logic circuit which is sufficiently scaled out is too strong. In such a case, an attenuating circuit must be inserted separately to attenuate the signal level of the pulse. From this reason, the signal which is not scaled out sufficiently is more convenient Although an output from the inverter circuit 109 on the last stage is not used, it is provided for regulating the amount of delay of each stage by regulating fan-outs (loads) connected to the inverter circuits 101 to 108 on the precedent stages. In the same manner, as regards the inverter circuit 101 on the front most stage, it is preferable to use an inverter having the same characteristic as others so that the signals supplied to the NAND circuit 110 are driven by the inverter having the same characteristic.

The pulse train having a cycle Tp as shown in FIG. 6A can be obtained by supplying a signal which drops once at every time period Tp shown in FIG. 6A to the terminal D0.

The pulse widths of pulses outputted from the NAND circuits 110 to 113 are only the delay time td from rising points of inputs to drop points of outputs of the inverter circuits 102, 104, 106 and 108, and hence has an effect as much as three times that of 3td in the related art.

In other words, according to the pulse generating circuit in the first embodiment, short pulses having a high-frequency component which could not be achieved by the circuit in the related art can be generated. In addition, since the pulse generating circuit in this embodiment has a simple circuit configuration with the combination of the inverter circuits, the NAND circuit, and the NOR circuit, the UWB communication system is realized by a semiconductor integrated circuit manufactured by a simple CMOS process.

Second Embodiment

Figure 2:
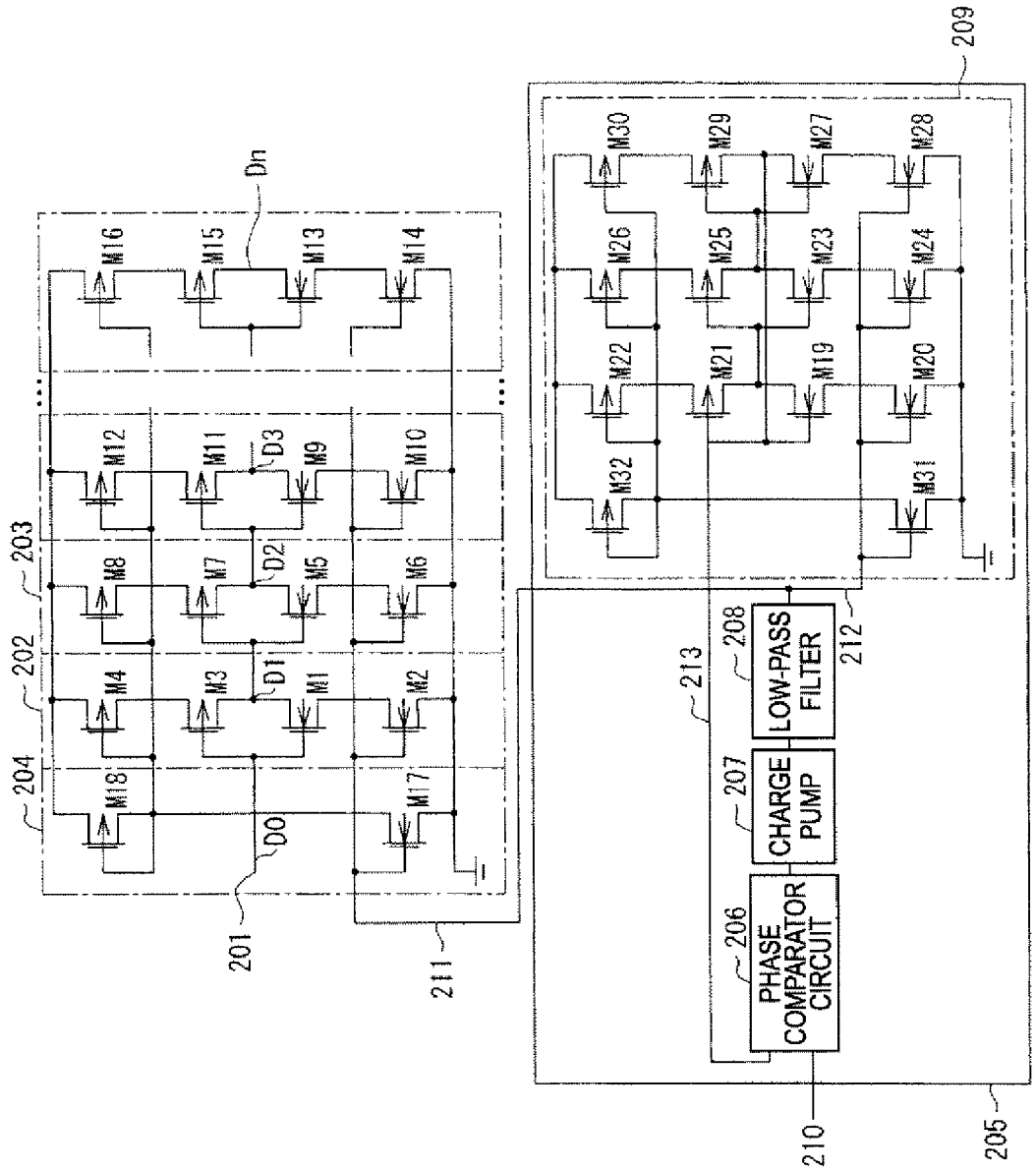
FIG. 2 is a circuit diagram showing a principal portion of a pulse generating circuit according to a second embodiment of the invention.

FIG. 2 is a circuit diagram showing a principal portion of a pulse generating circuit according to a second embodiment of the invention.

Reference numerals 202, 203 designate inverter circuits in which the amount of delay can be controlled and correspond to the inverter circuits 101, 102 which constitutes the delay circuit in the first embodiment. The equivalent circuits are arranged in the required number of stages for use. In FIG. 2, those from the third stage on are not numbered. The inverter circuit 202 is configured by a combination of a PMOS transistor M3 and an NMOS transistor M1.

PMOS and NMOS transistors M4 and M2 are connected to sources of the respective transistors M3 and M1, and the amount of delay can be controlled by controlling the amount of electric current flowing into the inverter circuit by the M4 and M2.

A gate of the transistor M2 is connected to a control voltage terminal 211, and a gate of the transistor M4 is connected to the control voltage terminal 211 via a current mirror circuit 204, so that a voltage applied to the control voltage terminal 211 is connected to a voltage inverted from VDD.

The configuration of the inverter is the same for the circuits indicated by other reference numerals M5 to M8, MD to M12, and M13 to M16.

The inverter circuits configured as described above are connected by the required number of stages to configure a delay circuit. Reference numerals D0 to Dn (n represents the required number of stages) in FIG. 2 correspond to D0 to DD in FIG. 1A, and are connected to an AND circuit respectively in the same manner (not shown) as in the first embodiment to generate intended pulses. A terminal 201 is a trigger terminal which corresponds to D0 in FIG. 1A, and the intended pulses are generated on the basis of pulses supplied to the terminal 201.

In order to control the amount of delay of the delay circuit, accurate control can be achieved by determining the voltage applied to the control voltage terminal 211 as described below, whereby pulses having a pulse width with a high degree of accuracy can be generated.

Reference numeral 209 is a ring oscillation circuit configured of inverter circuits having the same electric characteristics as the inverter circuits 202, 203. The ring oscillation circuit 209 can control the amount of delay by controlling a current flowing into the inverters which are the components thereof, whereby the oscillation frequency can be changed. In other words, the oscillation frequency can be changed according to the voltage applied to the terminal 212.

The phase of an-output 213 from the ring oscillation circuit 209 is compared with a reference frequency applied to a reference frequency terminal 210 by a phase comparator circuit 206, and the phase difference is outputted. A charge pump 207 outputs an electric charge to a low-pass filter 208 according to the phase difference signal outputted from the phase comparator circuit 206. An output of a DC component of the low-pass filter 208 is applied to the control voltage terminal 212 of the ring oscillation circuit 209. Therefore, the ring oscillation circuit 209, the phase comparator circuit 206, the charge pump 207, and the low-pass filter 208 configure a phase-locked loop 205.

A voltage of the control voltage terminal 211 is controlled so that the oscillation frequency of the output 213 from the ring oscillation circuit 209 constantly coincides with the reference frequency applied to the reference frequency terminal 210. When this voltage is used for the control of the amount of delay of the inverter circuits 202, 203 and so on which constitute the delay circuit, the same amount of delay as the amount of delay of the inverter circuit of the ring oscillation circuit 209 is achieved. Since the inverter circuit of the ring oscillation circuit 209 and the inverter circuits 202, 203 as the delay circuits are manufactured to have the same electric characteristics, the amounts of delay are the same.

In the second embodiment, the case in which the ring oscillation circuit 209 is configured in such a manner that the delay circuits are arranged in the three stages indicated by the reference numerals M19 to M32 is shown in the drawing. However, it is also possible to employ the oscillation circuits arranged in the larger number of stages as occasion demands, so that the oscillation frequency is lowered to simplify the configuration. In general, a frequency divider circuit is inserted between the outputs of the phase comparator circuit 206 and the ring oscillation circuit 209 so as to comply with the value of the reference frequency (not shown).

According to the pulse generating circuit in the second embodiment, the intended pulses can be generated with higher degree of accuracy. This contributes not only a free setting of the pulse width of the pulses to be outputted, but also to an elimination of various causes of errors such as variations in manufacturing process of the semiconductor integrated circuits which constitute the circuit. Accordingly, the process yield is increased and manufacture is facilitated, whereby cost reduction may be achieved.

The pulse generating circuit in the second embodiment has been described based on the premise that the inverter circuit of the ring oscillation circuit 209 and the inverter circuits 202, 203 of the delay circuit are the same in electric characteristics. However, the causes of error such as variations in manufacturing process or the like can be eliminated even though the characteristics are not the same as long as they are analogous. It is also possible to increase flexibility in change of the reference frequency or in design of the phase-locked loop 205 by changing the configuration such as inserting the frequency divider circuit between the output of the ring oscillation circuit 209 and the phase comparator circuit 206, whereby a scale of the voltage generating circuit for controlling the amount of delay of the delay circuit can be reduced to alleviate the load thereof.

Therefore, the pulse generating circuit in the second embodiment can generate pulses with a high degree of accuracy having a wide and high frequency component easily with a simple circuit. In addition, various causes of error such as the variations in manufacturing process of the semiconductor integrated circuit can be eliminated, and hence it can be manufactured easily.

Third Embodiment

Figure 3:
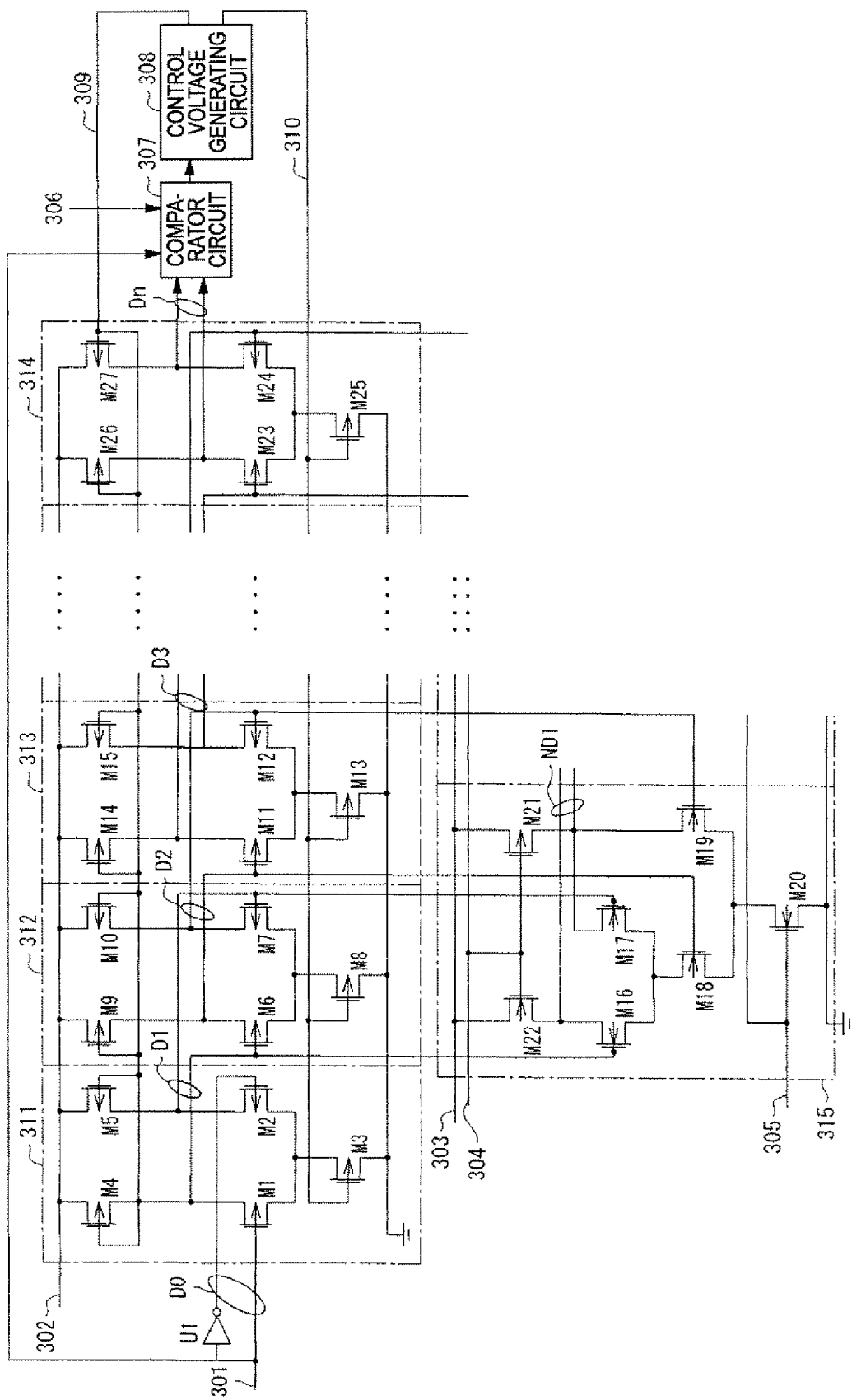
FIG. 3 is a circuit diagram showing a principal portion of a pulse generating circuit according to a third embodiment of the invention.

FIG. 3 is a circuit diagram showing a principal portion of a pulse generating circuit according to a third embodiment of the invention.

Reference numerals 311 to 314 are buffer circuits configured of current mode logic circuits. The contents thereof will be described with the buffer circuit 311 as an example. A differential amplifier circuit is configured by an NMOS transistor differential pair M1 and M2. The NMOS transistor M3 controls the amount of delay by controlling the circuit current according to a control voltage 310 applied to the gate. PMOS transistors M4, M5 are loads on the output side and control the output amplitude by the gate application voltage. Input and output of the buffer circuit 311 is driven by a differential signal which is a characteristic of the current mode logic circuit.

The terminal 301 is a trigger terminal which corresponds to the terminal D0 in the first embodiment, and intended pulses are generated on the basis of the pulses which are entering therein. In this embodiment, a case in which the trigger signal is not a differential signal, but a normal logic signal is exemplified, and generates a differential signal D0 by an inverter circuit U1 for the connection to the current mode logic circuit.

The buffer circuits 311 to 314 generate differential delay signals D1 to Dn. In these circuits 311 to 314, D1 is generated directly from D0 and conditions are different from a case in which D2 is generated from D1, for example. In other words, D1 of the buffer circuit 311 is driven and generated by the trigger signal applied to the trigger terminal 301 and the inverter circuit U1, while D2 is generated when D1 is driven. When the difference is bothering, another stage of the buffer circuit having the same characteristic before D1 may be inserted.

D1 to Dn are sent to the logic circuit to generate intended pulses. Reference numeral 315 designates a logic circuit which takes a logical multiple of D1 and D2 and outputs an AND ND1. ND1 is sent to the OR circuit together with outputs from other AND circuits to generate intended pulses as in the case of the first embodiment (these circuits are not shown).

The amount of delay in the delay circuit of an-output Dn of the buffer circuit 314 in the last stage of the delay circuit is compared with a reference pulse entering into the terminal 305 by the comparator circuit 307. In other words, the time period until Dn is outputted from the trigger signal entering into the terminal 301 and the pulse width of the reference pulse entering into the terminal 305 are compared by the comparator circuit 307 and the result is transmitted to the control voltage generating circuit 308. The control voltage generating circuit 308 outputs the control voltage 310 for adjusting the amount of delay in the delay circuit on the basis of the result of comparison in the comparator circuit 307 and applies the same to gates of current limiting transistors (NMOS transistor) of the respective buffer circuits 311 to 314 which constitute the delay circuit.

At the same time, the control voltage generating circuit 308 also controls the output amplitudes to a constant value by changing a gate voltage 309 of a load transistor (PMOS transistor) on the output side in association with the change of the control voltage 310 since the output amplitudes are changed in association with the change of the incoming currents to the respective buffer circuits 311 to 314. In the case of the pulse width control in the third embodiment, even though the pulse generated for the first time may have an error, it can generate accurate pulses from the second time on since the pulses generated from the second time on can be adjusted by correcting the control voltage on the basis of the result of the previous pulse generation. In the application of the UWB communication, such inaccuracy of the first pulse is not a serious problem. Therefore, the capability of generating pulses with a high degree of accuracy with such a simple configuration as this embodiment is very effective.

Since the current mode logic which has a capability of high-speed operation is employed, operation at a maximum frequency for the performance of elements which constitute the circuit is possible at low power consumption.

According to the pulse generating circuit in the third embodiment described thus far, high-frequency high-accuracy pulses can be generated with a simple circuit. Since this enables free setting of the pulse width of the pulses to be outputted and, in addition, can eliminate various causes of various errors due to the variations in manufacturing process of the semiconductor integrated circuits which constitute the circuit, manufacture is facilitated, whereby cost reduction may be achieved.

Fourth Embodiment

Figure 4:
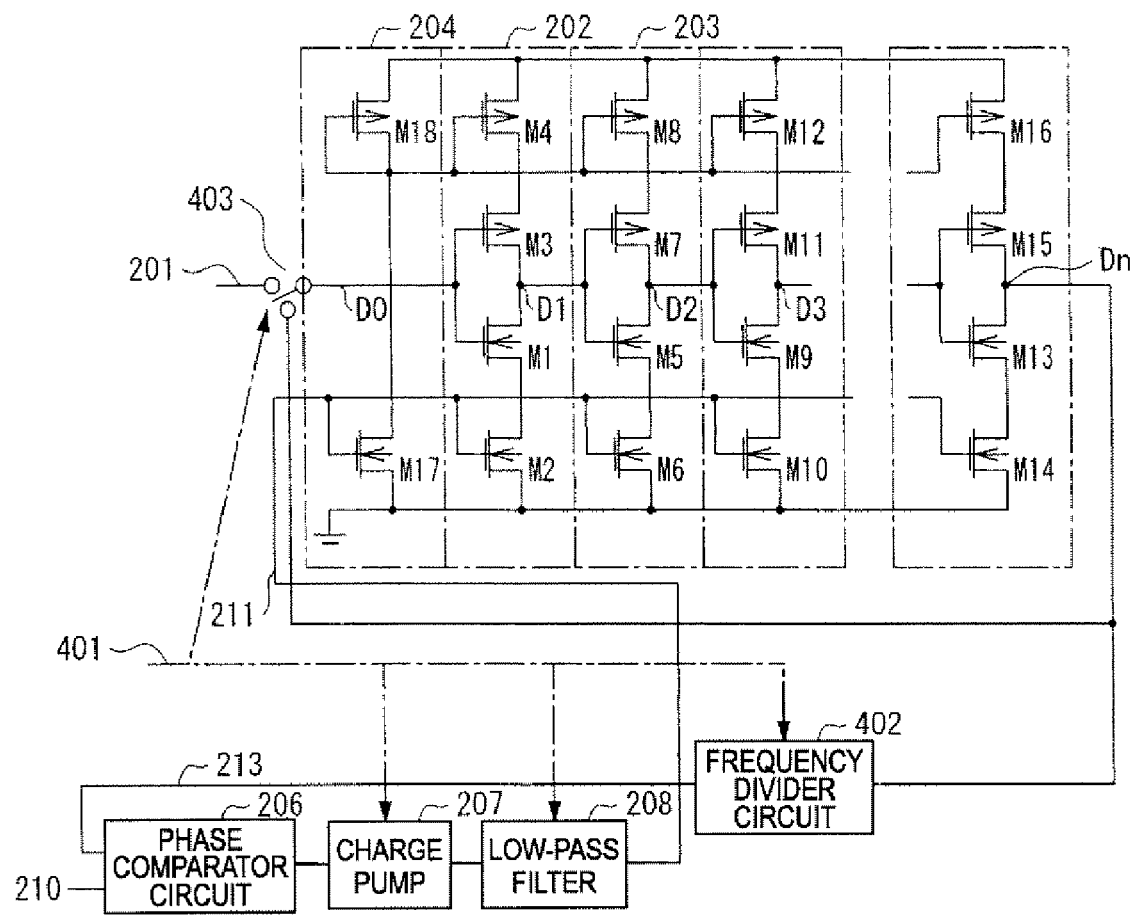
FIG. 4 is a circuit diagram showing a principal portion of a pulse generating circuit according to a fourth embodiment of the invention.

FIG. 4 is a circuit diagram showing a principal portion of a pulse generating circuit according to a fourth embodiment of the invention.

In the second embodiment, the delay circuits 202, 203 . . . and the ring oscillation circuit 209 are provided separately. However, in this embodiment, an example in which these circuits are shared by switching will be described. The blocks designated by the same reference numerals as in FIG. 2 are the same as those in the second embodiment, and hence the description will be omitted.

The pulse generating circuit is switched between a calibration mode and a pulse generating mode by a signal applied to a terminal 401. When a signal which specifies a configuration mode is applied to the terminal 401, a switch 403 performs a switching operation to connect an input of the delay circuit 202 to an output of the delay circuit at a predetermined stage and hence to constitute a ring oscillation circuit of the predetermined number of stages and, simultaneously, to activate a frequency divider circuit 402 (not shown in the drawing in the second embodiment), the phase comparator circuit 206, the charge pump 207, the low-pass filter 208 to constitute the phase-locked loop.

When the phase-locked loop is locked to the reference frequency applied to the reference frequency terminal 210, calibration is completed. When in calibration mode, the logic circuit for generating pulses is set to be inactive by a signal to be applied to the terminal 401.

When a command signal of the pulse generating mode enters the terminal 401, the switch 403 switches the input of the delay circuit 202 to the trigger terminal 201 side and waits for a signal of pulse generation. Simultaneously, the logic circuit for generating the pulses is activated, and the phase-locked loop is released. The output of the low-pass filter 208 maintains a value at the time when the phase-locked loop is locked. The delay circuits 202, 203 . . . calibrate the phase-locked loop, and are driven at a control voltage (the voltage of the control terminal 211) at the time when the phase-locked loop is locked. Therefore, the amount of delay is equal to the locked amount when the phase-locked loop is locked. Accordingly, pulses having accurate pulse widths can be generated.

Fifth Embodiment

Figure 5A:
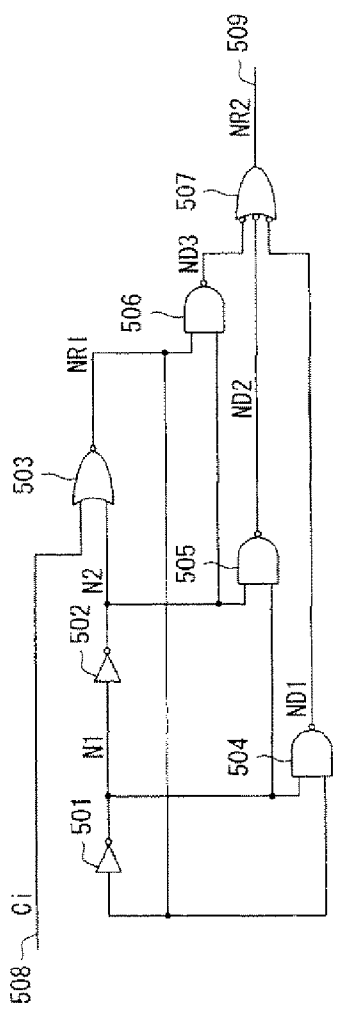
FIGS. 5A and 5B illustrate a circuit diagram showing a pulse generating circuit and a time chart showing the operation thereof according to a fifth embodiment of the invention.

FIG. 5A is a circuit diagram showing a principal portion of the pulse generating circuit according to a fifth embodiment of the invention. FIG. 5E is a time chart showing the operation thereof.

When the trigger signal is applied to the trigger terminal, the pulse generating circuit in the first to the fourth embodiments issues pulses having a predetermined number of fingers, which is determined by the number of stages of the delay circuits and the AND circuit, and stops. When the number of fingers increases, the scale of the required circuit increases in association therewith. This embodiment is an example in which the scale of the circuit is not increased even when a pulse having a large number of fingers is generated.

Figure 5B:
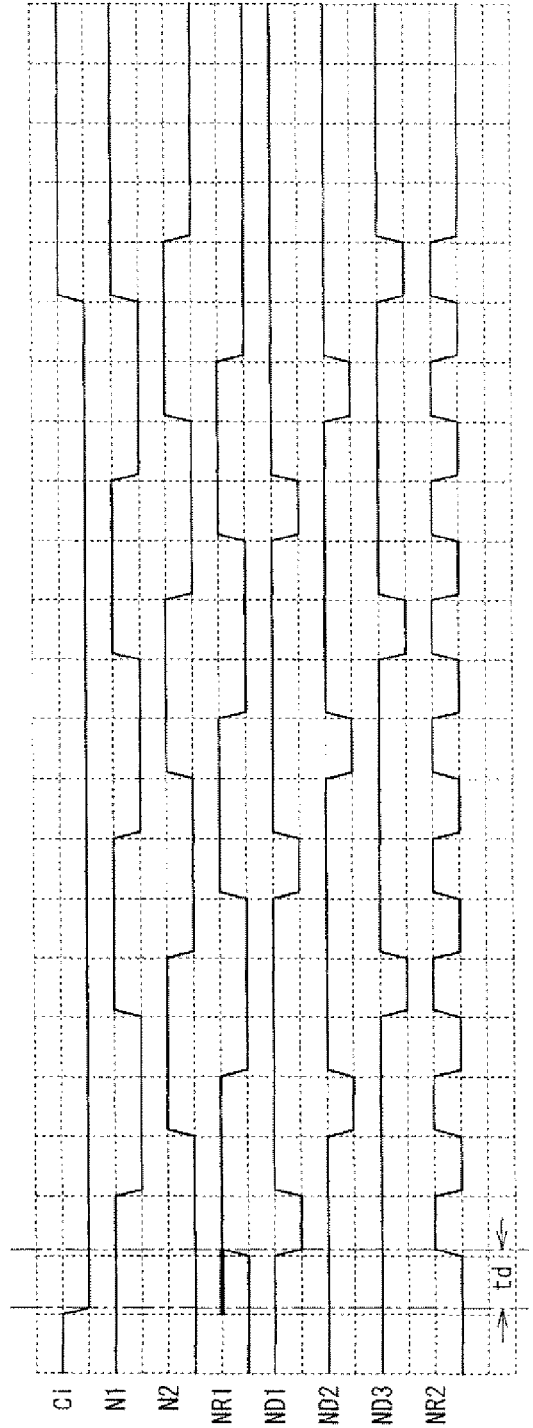

In FIG. 5A, reference numeral 503 designates a NOR circuit, which initiates the same operation as an inverter when a signal Ci applied to a trigger terminal 508 becomes false (L). Assuming that the Ci becomes L, the output NR1 is delayed by a delay time td of the NOR 503 and becomes H as shown in FIG. 5B. The inverters 501, 502 issues signals which are delayed by the delay times of the respective inverters according to the change of the output NR1 of the output NOR 503, and constitute a ring oscillation circuit together with the NOR 503 to start oscillation.

Reference numerals N1, N2 in FIG. 5B represent outputs of the inverters 501, 502, respectively. For simplification, a description will be made assuming that the delay times of the inverters 501, 502 and the NOR 503 are the same. Consequently, the oscillation cycle of the ring oscillation circuit is 6td as can be seen from N1, N2 and NR1 in the drawing.

NAND circuits 504, 505, 506 output L when both NR1 and N1, N1 and N2, and N2 and NR1 are H. Reference numerals ND1, ND2, ND3 in FIG. 5B designate output signals of the NAND circuits 504, 505, 506, respectively.

Reference numeral 507 designates OR circuit of negative logic, that is, NOR circuit, and outputs H from an output terminal 509 when at least one of the NAND circuits 504, 505, 506 is L. Reference numeral NR2 in FIG. 5B designates an output of the NOR circuit 507.

As can be seen in the same drawing, the output NR2 generates pulses of a cycle 2td continuously as long as Ci is L. It is understood that the width of the generated pulses is as small as ⅓ of the pulse width in the related art.

A period during which the pulse generation is continued (the number of fingers of the pulse) can be controlled by Ci, and a pulse train having a large number of fingers can be generated with narrow pulses which could not be generated in the circuit in the related art without increasing the number of elements in the circuit.

The example in which the ring oscillation circuit of three stages has been used has been described in the fifth embodiment. However, the number of stages in the ring oscillation circuit may be a number other than three.

In this case, it is necessary to increase the number of the NAND circuits according to the number of stages, and to equalize the number of inputs of the NOR circuit with the number of the NAND circuits. In this arrangement, the number of elements of the circuit increases, but the oscillation frequency of the ring oscillation circuit is lowered according to the number of stages. Therefore, current consumption of the circuit is almost the same.

The pulse generating circuit in the fifth embodiment can compare the ring oscillation circuit with the phase-locked loop including the oscillation circuit having the same characteristic as the ring oscillation circuit and increase accuracy of the oscillation cycle, or generate a pulse train having a narrower cycle using the current mode logic circuit as in the second to the fourth embodiments.

Subsequently, the pulse shape generated and used in some aspects of the invention will be described before describing the embodiment of the invention from a sixth embodiment on.

Figure 6B:
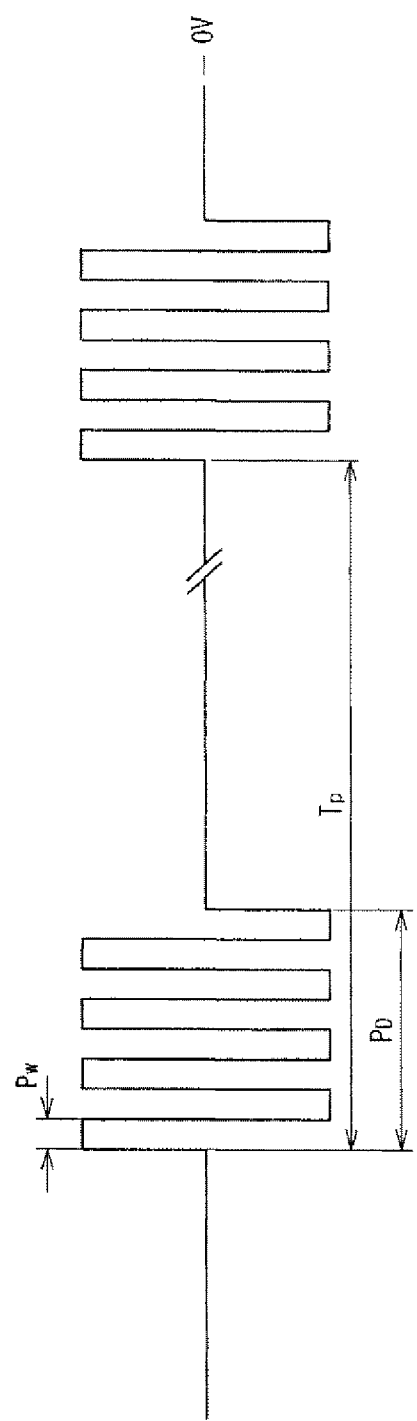

FIGS. 6A and 6B show pulse shapes to be generated in some aspects of the invention. FIG. 6A shows a waveform which can be obtained by multiplying the pulse waveform shown in FIG. 16A by a sinusoidal wave carrier of a cycle 2Pw(=1/f).

Figure 16A:
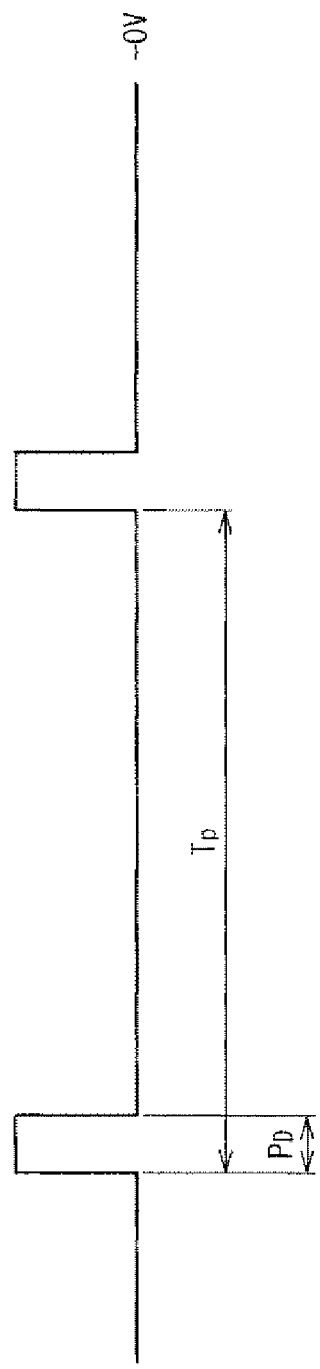
FIGS. 16A and 16B are explanatory drawings for describing pulses used for an UWB communication.
Figure 16B:
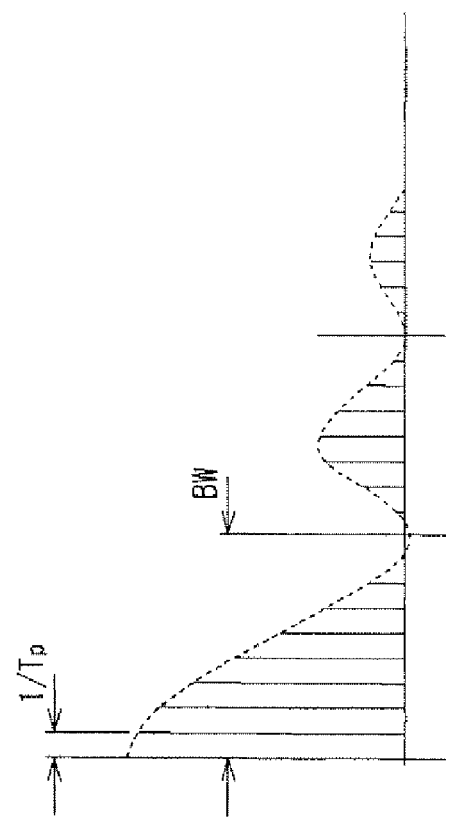
Figure 17A:
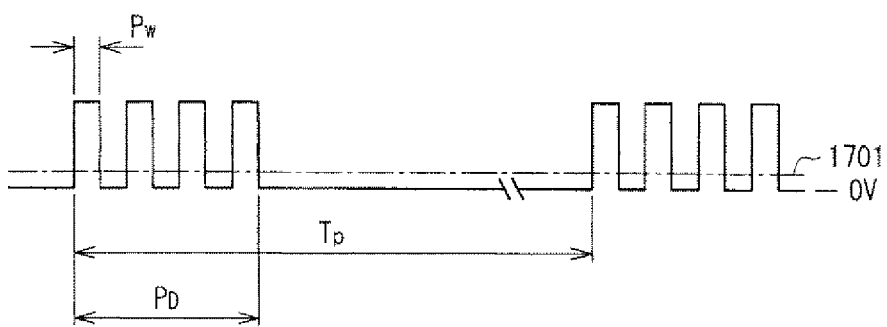
FIGS. 17A and 17B are explanatory drawings for describing other pulses used for the UWB communication.
Figure 17B:
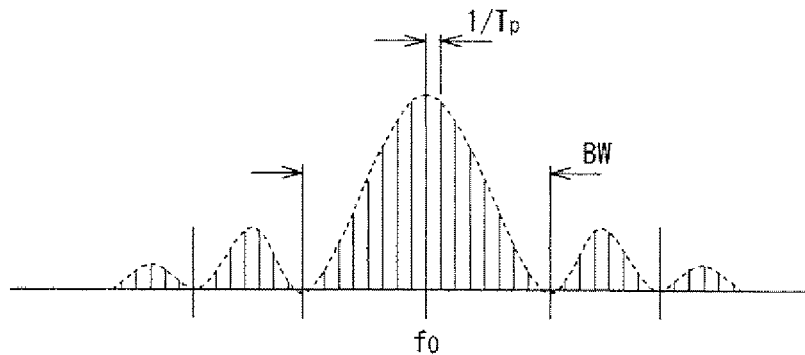
Figure 18A:
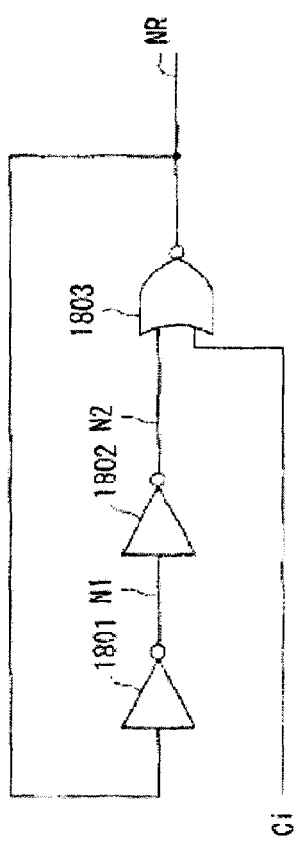
FIGS. 18A and 18B are drawings of the pulse generating circuit in the related art and a time chart showing the operation thereof.
Figure 18B:
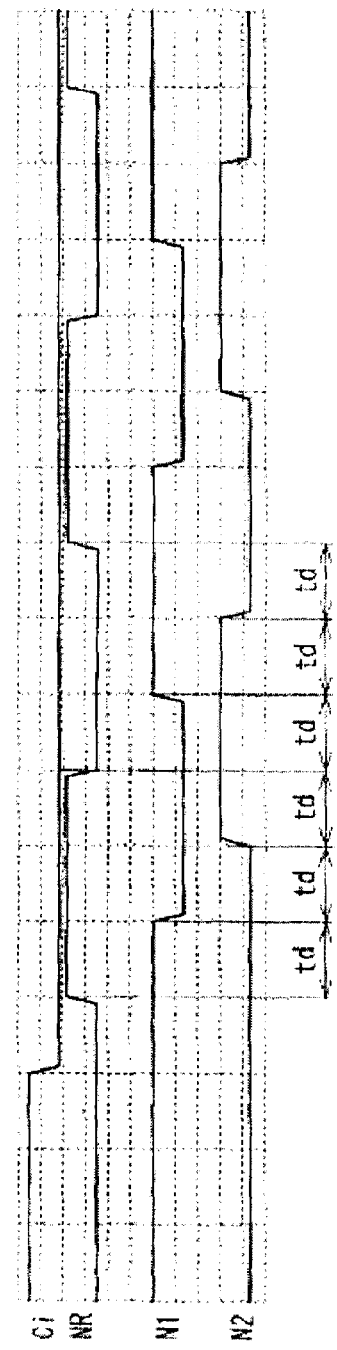

In the same manner, FIG. 6B shows a waveform which can be obtained by multiplying a pulse waveform shown in FIG. 16A by a square wave carrier of cycle 2Pw(=1/f). The waveform in FIG. 6B is easier to realize by a binary digital circuit. However, the waveform in FIG. 6A has less unnecessary side waves and hence is convenient. However, although the waveform in FIG. 6B can be generated easily in the digital circuit, since the frequency is high, it is difficult to generate the angular waveform as shown in the drawing and hence a waveform similar to the waveform shown in FIG. 6A is naturally obtained.

In this specification, a case in which a waveform according to following parameters is generated will be described as an example. However, the invention is not limited to this example.

Pulse Distance: Tp=5 nsec
Carrier frequency: f=8 GHz
Carrier pulse width: Pw=62.5 psec
Pulse width: $P_D$=500 psec
Number of Pulses contained in Period P: four ($P_D$=8Pw)

Referring now to the drawings, the pulse generating circuit according to the embodiment of the invention will be described below.

Sixth Embodiment

Figure 7A:
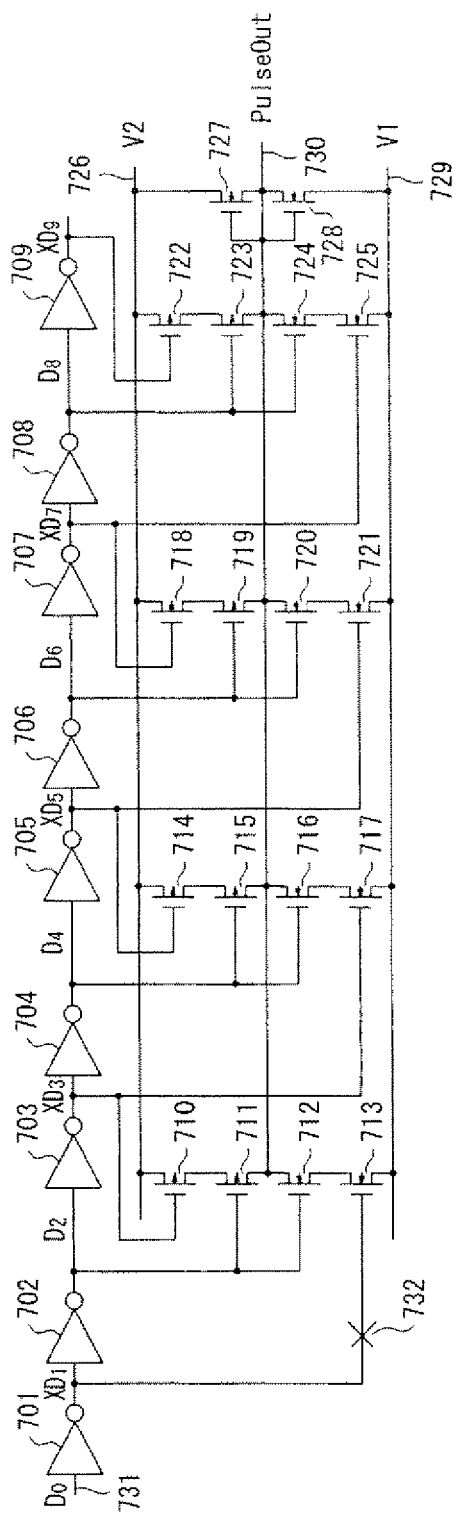
FIGS. 7A and 7B illustrate circuit diagrams showing a pulse generating circuit according to a sixth embodiment of the invention.
Figure 7B:
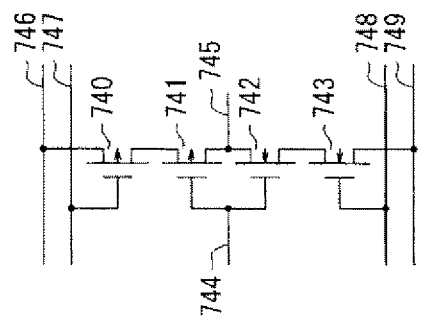
Figure 8:
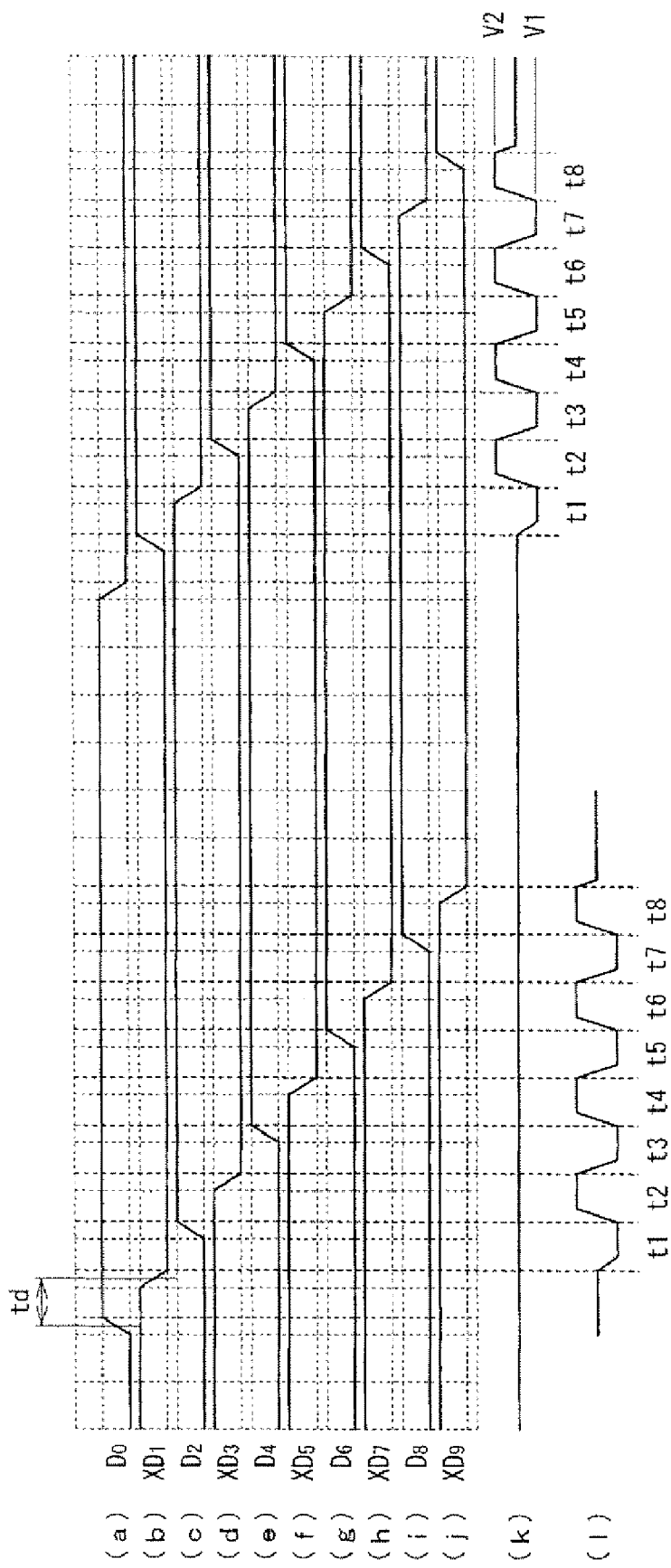
FIGS. 8A to 8L are time charts for describing the operation of the pulse generating circuits according to the sixth embodiment and the second embodiment

FIG. 7A is a circuit diagram showing a principal portion of a pulse generating circuit according to a sixth embodiment of the invention, and FIG. 7B is a drawing for describing the interior of an example of a delay circuit as a component thereof in detail. FIG. 8 illustrates time charts for describing the operation thereof.

In FIG. 7A, reference numerals 701 to 709 are a delay circuit in which inverters of nine stages are cascaded. The configuration in the interior of each stage of the inverter is shown in FIG. 7B, which will be described later. A pulse $D_0$ entering into a terminal 731 is propagated in the delay circuit while being delayed by the time period td and inverted in logic every stage and outputted from the respective stages as shown in FIG. 8A to FIG. 8J. In other words, assuming that the signal applied to the input terminal 731 is a positive logic, in the $i^{th}$ stage, $XD_{2k-1}$ when i=2k−1,
$D_{2k}$ when i=2k, are outputted, where k represents an integer. Reference sign X represents a negative logic of the signal and is placed before the name of the signal.

N-channel MOS transistors 713 and 712 are conducted when the output $XD_1$ in the first stage and the output $D_2$ in the second stage of the delay circuit are respectively high to connect a pulse output terminal 730 to a first potential level V1. Subsequently, P-channel MOS transistors 210 and 211 are conducted when the output $D_2$ in the second stage and the output $XD_3$ in the third stage of the delay circuit are low (that is, when both of the negative logic of $D_2$ and $D_3$ are high (when the logical multiple is true) to connect a pulse output terminal 230 to a second potential level V2.

In the same manner, N-channel MOS transistors 716, 717, 720, 721, 724 and 725 are conducted when an output $XD_{2k-1}$ in the $2_{k-1}^{th}$ stage and an output $D_{2k}$ in the $2^{th}$ stage of the delay circuit are respectively high, that is, when the logical multiple of $XD_{2k-1}$ and $D_{2k}$ is true to connect the pulse output terminal 230 to the first potential level V1.

Subsequently, P-channel MOS transistors 714, 715, 718, 719, 722 and 723 are conducted when an output $D_{2k}$ in the $2k^{th}$ stage and an output $XD_{2k+1}$ in the $2k+1^{th}$ stage of the delay circuit are respectively low, that is, when the logical multiple of negative $XD_{2k}$ of $D_{2k}$ and $D_{2k+1}$ as the negative logic of $XD_{2k+1}$ is true to connect the pulse output terminal 730 to the second potential level V2.

According to the operation as described above, the pulse waveform as shown in FIG. 8K can be generated.

In this case, source potentials VSS, VDD on the negative side and the positive side of the integrated circuit which respectively constitute the circuit can be used as the first and second potential levels. However, it may be set to other desired potentials.

A P-channel MOS transistor 727 and an N-channel MOS transistor 728 are MOS resistances, and set the potential of the output terminal 730 when the first and second potentials V1, V2 are divided and the switch circuits of the MOS transistors 710 to 725 are not connected to any one of the first and second potentials V1, V2. They are normally designed in such a manner that these potentials take intermediate values between V1 and V2 while maintaining the symmetric property of constants of the N and P channel transistors.

FIG. 7B is a drawing showing the interior of the inverters 701 to 709 which constitute the delay circuit. A P-channel MOS transistor 741 and a N-channel MOS transistor 742 constitute the inverter circuit, and the signal entering into a terminal 744 is inverted and outputted from a terminal 745 with the delay time td.

A P-channel MOS transistor 240 and a N-channel MOS transistor 243 are inserted into a source of the transistor, which constitutes the above-described inverters respectively, in series, and are connected to a positive power source VDD terminal 746 and a negative power source VSS terminal 749. The source current incoming into the inverter can be controlled by controlling the gate potentials of these transistors.

With this control, the operating speed of the inverter can be controlled, and hence the value of td can be controlled. Pulse having an intended frequency spectrum can be generated simply by controlling the voltage of terminals 747, 748 so as to be Pw=td. When the voltages applied to these terminals are measured from the VSS side and are assumed to be Vpc, Vnc respectively, the output signals having good symmetry can be obtained normally by setting to be VDD-Vpc=Vnc.

One of the transistors 740 and 743 can be omitted. Since the delay characteristic of the delay circuit in this example is affected by a load, an output to the switch circuit can be connected via an adequate buffer circuit.

By employing the configuration as described above, most of the circuits can be designed as a digital binary circuit, and hence configuration is easy. In addition, since the circuits are operated complementarily, and when the circuits are in a static state, one of a P or N channel transistor is always in a non-conductive state. Therefore, the power consumed by the circuits is very low.

In addition, since the output circuit is driven directly by the MOS transistors 710 to 725, the possibility of distortion is low, and hence a signal of large amplitude and high power can be obtained.

The logical multiple and the logical sum may be counterchanged depending on the definition of the logical value (whether the low potential is assumed to be a logical true or false) on the basis of the axiom of Boolean algebra. However, these principles are based on the same concept.

Seventh Embodiment

FIG. 9A shows a seventh embodiment of the invention. In FIG. 9A, reference numerals 901 to 909 are delay circuits in which the inverters are cascaded in nine stages. The configuration of the interior of the inverter in each stage is the same as that shown in FIG. 7B, and the output in each stage is the same as that in the first embodiment.

In other words, the pulse $D_o$ entering into a terminal 931 is propagated in the delay circuit while being delayed by the time period td and logically inverted every stage and outputted from the respective stages as shown in FIG. 8A and FIG. 8J. That is, assuming that the signal to be applied to the input terminal 431 is a positive logic, in the $i^{th}$ stage, $XD_{2k-1}$ when i=2k−1, $D_{2k}$ when i=2k, are outputted, where k represents an integer. Reference sign X represents a negative logic and is placed before the name of the signal.

An N-channel MOS transistor 911 is conducted when the output $XD_1$ in the first stage and the output $D_2$ in the second stage of the delay circuit are low to connect a pulse output terminal 930 to the first potential level V1 by a NOR circuit 913. Subsequently, a P-channel MOS transistor 910 is conducted when the output $D_2$ in the second stage and the output $XD_3$ in the third stage of the delay circuit are high to connect the pulse output terminal 930 to the second potential level V2 by the operation of a NAND circuit 912.

In the same manner, N-channel MOS transistors 915, 919 and 923 are conducted when an output $XD_{2k-1}$ in the $2_{k-1}^{th}$ stage and an output $D_{2k}$ in the $2k^{th}$ stage of the delay circuit are respectively low, that is, when the negative logical multiple of $XD2_{k-1}$ and $D_{2k}$ is true to connect the pulse output terminal 930 to the first potential level V1.

Subsequently, P-channel MOS transistors 914, 918, and 922 are conducted when an output $D_{2k}$ in the $2k^{th}$ stage and an output $XD_{2k+1}$ in the $2k+1^{th}$ stage of the delay circuit are respectively high, that is, when the logical multiple of $D_{2k}$ and $XD_{2k+1}$ is true to connect the pulse output terminal 930 to the second potential level V2

According to the operation as described above, the pulse waveform as shown in FIG. 8L can be generated.

In the sixth embodiment, the pulse is outputted at a drop of the signal applied to the terminal $D_0$. However, in the seventh embodiment, the pulse is outputted at the rise of the signal. This is a result of a difference in whether $D_0$ to $D_9$ are viewed on the basis of the negative logic or the positive logic, and these are equivalent according to the axiom of Boolean algebra.

In the configuration as described above, the transistors 910, 911, 914, 915, 918, 919, 922, 923 which constitute the switch circuit directly connect the first and second potential levels and the pulse output terminal 930 in comparison with the first embodiment. In contrast, in the sixth embodiment, for example, the transistor 711 is connected to the second potential level via the transistor 710, which becomes an issue when the output impedance is desired to be lowered. In this embodiment, since the transistors are directly connected to V1 and V2, designing is easy when the output impedance of the signal is desired to be lowered.

In addition, in the sixth embodiment, for example, the transistors 711 and 712, or 710 and 717 are connected to the same signal $D_2$ or $XD_3$, Since the $D_2$ potential is in the middle of the power source and the transistor 710 and 713 are already conducted when the signal $D_2$ is changed from the high level to the low level, V1 and V2 are bound to be short circuited and hence an excessive current, so called a short current flows in a spiking manner.

In the same manner, since the $XD_3$ potential is in the middle of the power source and hence the transistor 211 and 216 are already conducted when the signal $XD_3$ is changed, that is, when it is changed from a low level to a high level, the V1 and V2 are bound to be short-circuited and hence an excessive current flows in a spiking manner, which may result in an increase in current consumption in the circuit.

In the seventh embodiment, the gates of the P, N channel transistors are not driven by the same signal. Therefore, they can be controlled so as not to be conducted at the same time, and hence the influence of the short current can be alleviated. This is achieved by delaying the dropping of the outputs from the NAND circuits 912, 916, 920 and 924 and anticipating the rising of the same, and by delaying the rising of the output from the NOR circuits 913, 917, 921 and 925 and anticipating the dropping of the same.

The NAND circuit is configured in such a manner that P-channel transistors 941, 942 are connected to the power source VDD on the positive side in parallel and N-channel transistors 943 and 944 are connected to VSS on the negative side in series as shown in FIG. 9B. The NOR circuit is configured in such a manner that N-channel transistors 948 and 947 are connected to the power source VSS in parallel and P-channel transistors 945 and 946 are connected to the power source VDD in series as shown in FIG. 9C.

When the transistors are connected in series, the impedance increases, and hence in the WAND circuit the output tends to drop late and rise early, while in the NOR circuit, the output tends to drop early and rise late. Therefore, the connection as in this embodiment can alleviate the short current. By designing the transistors connected in parallel in the NAND circuit or the NOR circuit to be large and the transistors connected in series in the same circuit to be small, the characteristics as described above are emphasized and the effect is increased.

Eighth Embodiment

FIG. 10A schematically shows the pulse waveform obtained in the first and second embodiments. In a state in which no load is applied, a waveform as designated by numeral 1001 should be outputted logically. However, the waveform is deformed by the output load, and when the load is light, the waveform is deformed as shown by numeral 1002, and when the load is very heavy, the waveform is deformed as shown by numeral 1003. In particular, assuming that an attempt is made to output a pulse train on the order of 8 GHz in 0.18 μ CMOS process, the waveform such as 1001 or 1002 cannot be obtained but is deformed as designated by 1003.

The waveform 1003 assumes a shape obtained by integrating the waveform 1001 when no load is applied thereon by the load capacity. Since the surface areas of the waveform 1001 on the positive side and on the negative side are equivalent, the integral waveform is shifted to the negative side as shown in the drawing. This waveform is not an intended waveform, and what is desired is a bipolar waveform as shown in FIGS. 6A and 6B.

The eighth embodiment shows a circuit which can output an intended waveform without distortion even when such a heavy load is driven. This object can be achieved by setting the pulses at a front edge and a rear edge of the output waveform to be narrower than other portions so that the integral waveform becomes uniform on the positive and negative sides as shown in the FIG. 10B.

Referring now to FIG. 10B, the principle of this operation will be described further in detail below. In FIG. 10B, a waveform shown in FIG. 10A is also drawn for comparison, and the waveforms designated by the same numerals are the same as those in the description shown above. These waveforms are not described to avoid redundancy. Reference numeral 1006 is a waveform in which the front and rear edges of the output waveform are reduced in width as described above. When a heavy capacity load is driven, such a waveform is integrated and a waveform which is uniform in the positive and negative sides as 1008 is obtained. This is the intended output pulse waveform The waveform in which the front and rear edges are narrowed as the waveform 1006 is realized by reducing the amounts of delay of the delay circuit in the second stage and the last stage in the first and second embodiments.

Conveniently, there is only one transistor or gate which is led to the final stage 709 or 909 of the delay circuit, and hence the fan-out load at the output thereof is lighter than that at other outputs. Therefore, it is easy to reduce the amount of delay in the final stage In the same manner, the fan-out load of the inverter 701 or 901 in the first stage is one and hence the load is light. However, the amount of delay of the inverter 702 or 902 must be reduced for reducing the pulse width. Here, the inverters 701, 901 are simply buffers, and the amount of delay in this stage does not relate to the outputted waveform. The amount of delay can easily be reduced by enlarging the transistors 740 and 743 of the inverter cell in the delay circuit which is shown again in FIG. 10C in comparison with other stages.

Another method for setting the pulse waveform so as to narrow the pulse of the output waveform at the front edge as shown in FIG. 10B can be achieved by inserting signal delaying elements in series at a node 732 or 932 in FIG. 7A or FIG. 9A. This is because the signal of $XD_1$ in FIG. 8B is transmitted to the first AND circuit with a delay, that is, by being shifted slightly rightward in the same time chart by the action of the delaying elements.

Referring now to FIG. 10D, another method for preventing the output pulse waveform from shifting either toward the positive side or the negative side due to the capacity load as described above will further be described. In other words, in the same drawing, the speed of charging and discharging the load capacity of the output pulse 1001 must simply be lowered at the front and rear edges of the output pulse in comparison with others. In other words, the inclination of discharge is reduced at the front edge 1004 in comparison with the waveform 1003 which is obtained when no countermeasure is taken, and the inclination of charge is reduced at the rear edge 1005 in comparison with the waveform 1003. In order to do so, the switching transistor to be conducted at the front and rear edges, that is, 712, 713, 722 and 723 in FIG. 7A or 911 and 922 in FIG. 9A are set to be larger than the conduction impedance of other switching transistors, that is, the sizes (channel widths) of these transistors may be reduced.

In addition, as described above, the inverters 701, 901 in the first stages of the delay circuits in the first and second embodiments only work as a buffer. Therefore, these parts can be omitted. In this case, the input signal $D_0$ of the delay circuit is connected to the first AND circuit instead of the output $XD_1$ in the first stage of the delay circuit.

Pulses generated by the pulse generating circuits according to the description above have only 3.5 cycles, and are slightly different from the intended pulse shown in FIGS. 6A and 6B (configured with the pulse train of four cycles). It is easy to add the remaining half cycle. In other words, it can be achieved by adding the switch transistor to be connected to the delay circuit and the first potential level. In FIGS. 7A and 7B, a delay output $D_{10}$ is made by placing another delay circuit on the rear side of the delay circuit 709. Two N-channel switch transistors are inserted between the terminals 730 and 729 in series, and the gates of the respective transistors are connected to $XD_9$, $D_{10}$. Alternatively, in FIGS. 9A to 9C, another delay circuit is placed on the rear side of the delay circuit 909 to produce the delay output $D_{10}$. An N-channel switch transistor is inserted between the terminal 930 and 929 in series and the gate of this transistor is driven by NOR of the $XD_9$ and $D_{10}$.

In this manner, the remaining half cycle is added as 1010 or 1012 in FIG. 10E. The pulse width of the waveform 1010 is reduced in comparison with others to adjust the discharging time from the load capacity so that the intended pulse waveform as 1011 is obtained. The waveform 1012 is adjusted in a manner described above, that is, the conduction resistance of the switch transistor is increased to adjust the discharging time from the load capacity so that the intended pulse waveform as 1013 is obtained. The waveform obtained in this manner does not have a DC component. The DC component caused by a slight unbalance of the output pulse due to ON resistance of the switching transistor or variations in amount of delay in the delay circuit is automatically adjusted and cancelled from such a request that the total amount of the electric charge which is charged to and discharged from the load capacity must be zero.

As described thus far, according to some aspects of the invention, a short pulse having little distortion can be generated easily with a simple circuit even with a heavy capacity load.

Ninth Embodiment

The pulse generating circuit described above is extremely compact and consumes only little power and, in addition, can generate pulse signals ideal for being used in the UWB communication. Therefore, application to a minute power communication which does not exert an unnecessary influence to the periphery, and cannot be impeded easily from the periphery offers promising prospects.

For example, a preferred application is to a device including a mechanism (joint mechanism) in which transmission of a signal between two or more housings connected so as to allow relative displacement in terms of posture or position is performed wirelessly such as a universal joint or a hinge.

Figure 11:
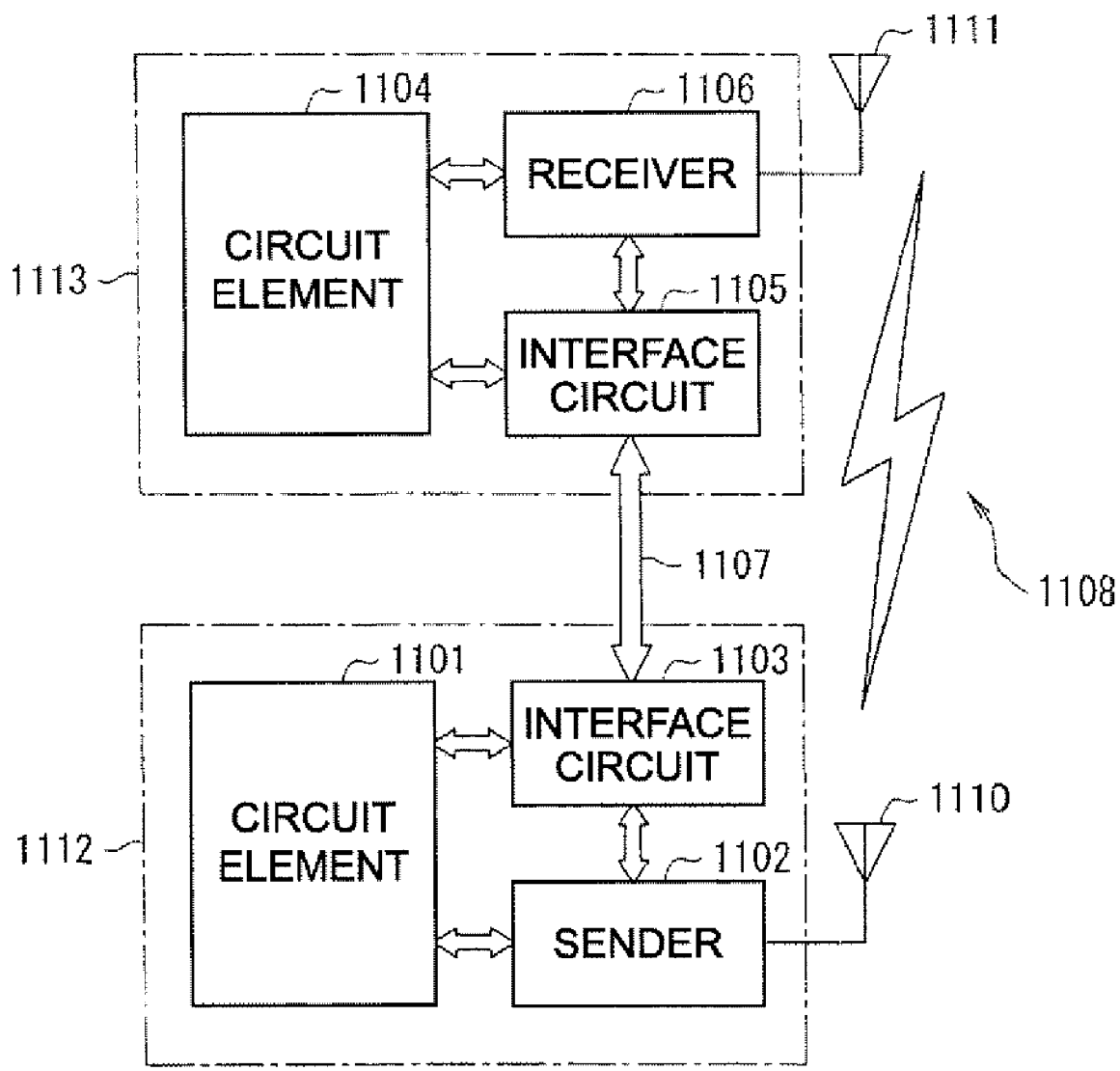
FIG. 11 is a block diagram showing a configuration of an electronic device as an embodiment of the invention in which the pulse generating circuit described in conjunction with FIG. 1A to FIG. 10E is applied so that a signal is transmitted between two housings each having an electronic circuit mounted thereto and connected by a mechanism member wirelessly communication.

FIG. 11 is a block diagram showing an example of the configuration of an electronic device as an embodiment of the invention in which the pulse generating circuit described in conjunction with FIG. 1A to FIG. 10E is applied so that a signal is wirelessly transmitted between two housings each having an electronic circuit mounted thereto and connected by a mechanism.

In FIG. 11, the two housings include a sender block 1112 on one side and a receiver block 1113 on the other side, and data is transmitted from the sender block 1112 to the receiver block 1113. In the sender block 1112, an electromagnetic wave is radiated from a circuit element 1101 generating or having sending information through a sending circuit 1102 and then through a sending antenna 1110.

In this embodiment, a circuit portion to which the pulse generating circuit described in conjunction with FIG. 1A to FIG. 10E is applied for supplying a sending power modulated corresponding to transmitted information to the sending antenna 1110 is configured in the sending circuit 1102.

The electromagnetic wave radiated from the sending antenna 1110 is propagated through a radio propagation path 1108 in the air.

The receiver block 1113 is provided with a circuit element 1104 which receives sending information propagated through the radio propagation path 1108 through the receiving antenna 1111 and the receiver 1106. Between the sender block 1112 and the receiver block 1113, the sender block 1112 is provided with an interface circuit 1103, and the receiver block 1113 is provided with an interface circuit 1105, so that a part of the signals or the power is given and received via a fixed line 1107 which connects the interface circuits 1103, 1105.

It is easy to transmit a low-speed signal through the fixed line, and a synchronous signal in the wireless communication unit can be transmitted. Accordingly, troublesome procedures or circuits, such as synchronous acquisition or tracking, are not necessary in the wireless communication unit, and hence the circuit can be simplified. In addition, it is also possible to send a cryptic key for enhancing security for communicating wirelessly while changing the key as needed.

The electromagnetic field radiated from the sending antenna 1110 is set not to exceed the upper limit specified by law. A radiation level allowed as a radio station which does not require a license is a level which is further lower than the regulation of EMI. However, since the communication distance is extremely close, a communication path of a sufficiently good quality can be secured by setting the link budget adequately.

Since information which requires a high-speed transmission as data including an image is not transmitted via a signal line, but is propagated in air wirelessly, it is not necessary to use the signal line, and hence various problems in terms of mechanism, electricity or manufacture in the connector or the hinge structure (connecting mechanism member) in association therewith can be avoided.

In the transmission with the signal line in the related art, there are problems such that charging to and discharging from the floating capacity is increased in association with speeding up thereof, and hence power consumption is increased, and an unnecessarily radiated power emitted from the signal line is increased, so that it becomes difficult to take a countermeasure for interference to peripheral equipment. Since the logic level is specified in the transmission via the signal line, it is not possible to substantially reduce the power consumption. In order to reduce the unnecessary radiation, there is only enforcement of a shield as a countermeasure.

In contrast, according to the configuration as in this embodiment, what is required is simply securing sufficient communication quality in an extremely close distance such as a distance within the same system, and hence the radiation power from the sending antenna 1110 can be lowered to a value as low as the required level, and hence an increase in power consumption is essentially improved, and the countermeasure for EMI can be performed easily. In addition, constraints such as an increase in power consumption, arrangement of parts, layout of the line and the like in association with the terminal of impedance matching of the communication wire path are released.

In the example of the configuration shown in FIG. 11, although the description is made as if the data is sent from the sender block 1112 exclusively to the receiver block 1113, a configuration in which communication is made bi-directionally between the blocks is also applicable.

Tenth Embodiment

Figure 12B:
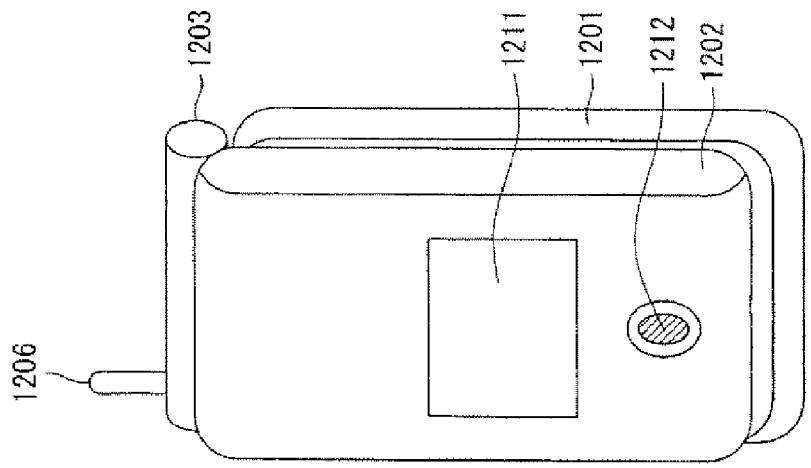
FIGS. 12A and 12B illustrate an example in which the wireless communication described in conjunction with FIG. 11 is applied to a clamshell type cellular phone.
Figure 12A:
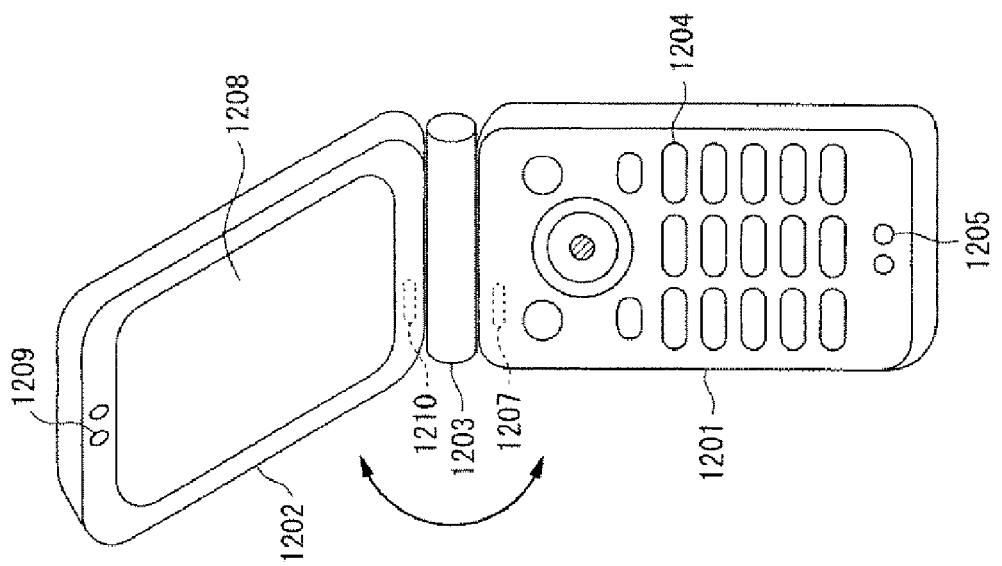

FIGS. 12A and 12B illustrate an example to which the wireless communication described in conjunction with FIG. 11 is applied to a clamshell-type cellular phone. FIG. 12A is a perspective view showing a state in which the clamshell-type cellular phone is opened, and FIG. 12B is a perspective view showing a state in which the clamshell-type cellular phone is closed.

In FIG. 12A and FIG. 12B, operating buttons 1204 are arranged on a surface of a first housing 1201, a microphone 1205 is provided at a lower end of the first housing 1201, and an external wireless communication antenna 1206 is mounted to an upper end of the first housing 1201. On a surface of a second housing 1202 (a surface revealed in the opened state), there is provided a display member 1208 and a speaker 1209 is provided at the upper end of the second housing 1202.

On the back surface of the second housing 1202 (the outer surface in the closed sate), there is provided a display member 1211 and an image-pickup element 1212. For example, a liquid crystal display panel, an organic EL panel, a plasma display panel, and so on can be applied as the display members 1208 and 1211. The image pickup element 1212 which may be applied here includes a CCD or CMOS sensor.

The first housing 1201 and the second housing 1202 are provided with internal wireless communication antennas 1207 and 1210 respectively for performing internal wireless communication between the first housing 1201 and the second housing 1202. As shown in the drawing, the first housing 1201 and the second housing 1202 are connected via a hinge 1203 as a connecting mechanism member, and the second housing 1202 can be folded on the first housing 1201 by rotating the second housing 1202 about the hinge 1203 as a supporting point.

The operating buttons 1204 can be protected by the second housing 1202 by closing the second housing 1202 on the first housing 1201, so that the operating buttons 1204 are prevented from being operated by mistake when the cellular phone is carried. When the second housing 1202 is opened from the first housing 1201, an operator can operate the buttons 1204 while viewing the display member 1208, talk while using the speaker 1209 and the microphone 1205, or take a picture while operating the operating buttons 1204.

By the employment of the clamshell structure, the display member 1208 can be arranged substantially over the entire surface of the second housing 1202, and hence the size of the display member 1208 can be enlarged without impairing the portability as the cellular phone, so that the visibility can be improved.

In the structure described above, this cellular phone includes a configuration in which the internal wireless communication antenna 1207 is provided in the first housing 1201 and the internal wireless communication antenna 1210 is provided in the second housing 1202 respectively, so that data transmission between the first housing 1201 and the second housing 1202 is performed by the internal wireless communication using the internal wireless communication antennas 1207 and 1210.

In other words, in the cellular phone in FIGS. 12A and 12B, the internal wireless communication antenna 1207 corresponds to the sending antenna 1110 in the electronic device in FIG. 11 and the internal wireless communication antenna 1210 corresponds to the receiving antenna 1111 in the electronic device in FIG. 11.

In the cellular phone in FIGS. 12A and 12B, a circuit portion corresponding to the sender block 1112 including the circuit portion corresponding to the sender 1102 in the electronic device in FIG. 11 is provided on the side of the internal wireless communication antenna 1207 (on the side of the first housing 1201).

In the same manner, a circuit portion corresponding to the receiver block 1113 including the circuit portion corresponding to the receiver 1106 in the electronic device in FIG. 11 is provided on the side of the internal wireless communication antenna 1210 (on the side of the second housing 1202) of the cellular phone in FIGS. 12A and 12B.

As described above in conjunction with the device in FIG. 11, assumption of the sending side and the receiving side is just for convenience, and the point that the device can be configured to be capable of bidirectional communication is also applied in FIGS. 12A and 12B, as a matter of course.

In the configuration as described above, for example, image data or sound data taken into the first housing 1201 via the external wireless communication antenna 1206 can be sent to the second housing 1202 by the internal wireless communication using the internal wireless communication antenna 1207 and 1210 to display the image on the display member 1208 or output sound from the speaker 1209

The image data picked up by the image pickup element 1212 can be sent from the second housing 1202 to the first housing 1201 by the internal wireless communication using the internal wireless communication antenna 1207 and 1210 to be sent to the outside via the external wireless communication antenna 1206. As described above, it is no longer necessary to transmit data between the first housing 1201 and the second housing 1202 with a fixed line, and hence it is no longer necessary to pass the multi-pin flexible wiring board through the hinge 1203.

Therefore, an increase in complexity of the structure of the hinge 1203 is prevented, and hence complication of a mounting process can be avoided, whereby an increase in cost can be constrained, and a reduction in size and thickness and improvement of reliability of the cellular phone as well as an increase in screen size and in function of the cellular phone without impairing portability of the cellular phone are achieved In this manner, usage of the wireless communication in the interior of the equipment for transmitting signal is very effective, while usage of pulse communication using the pulse generating circuit according to the invention for the internal communication enables wireless communication superior in interference-giving property and interference resistant property. In other words, in the electronic equipment having separately a communication circuit which is an essential object of the equipment as in the case of the cellular phone, the influence or hindrance for the wireless communication which is the essential object, or the influence or hindrance received from the wireless communication which is the essential object of the equipment can be reduced to a minimum level.

Eleventh Embodiment

Figure 13:
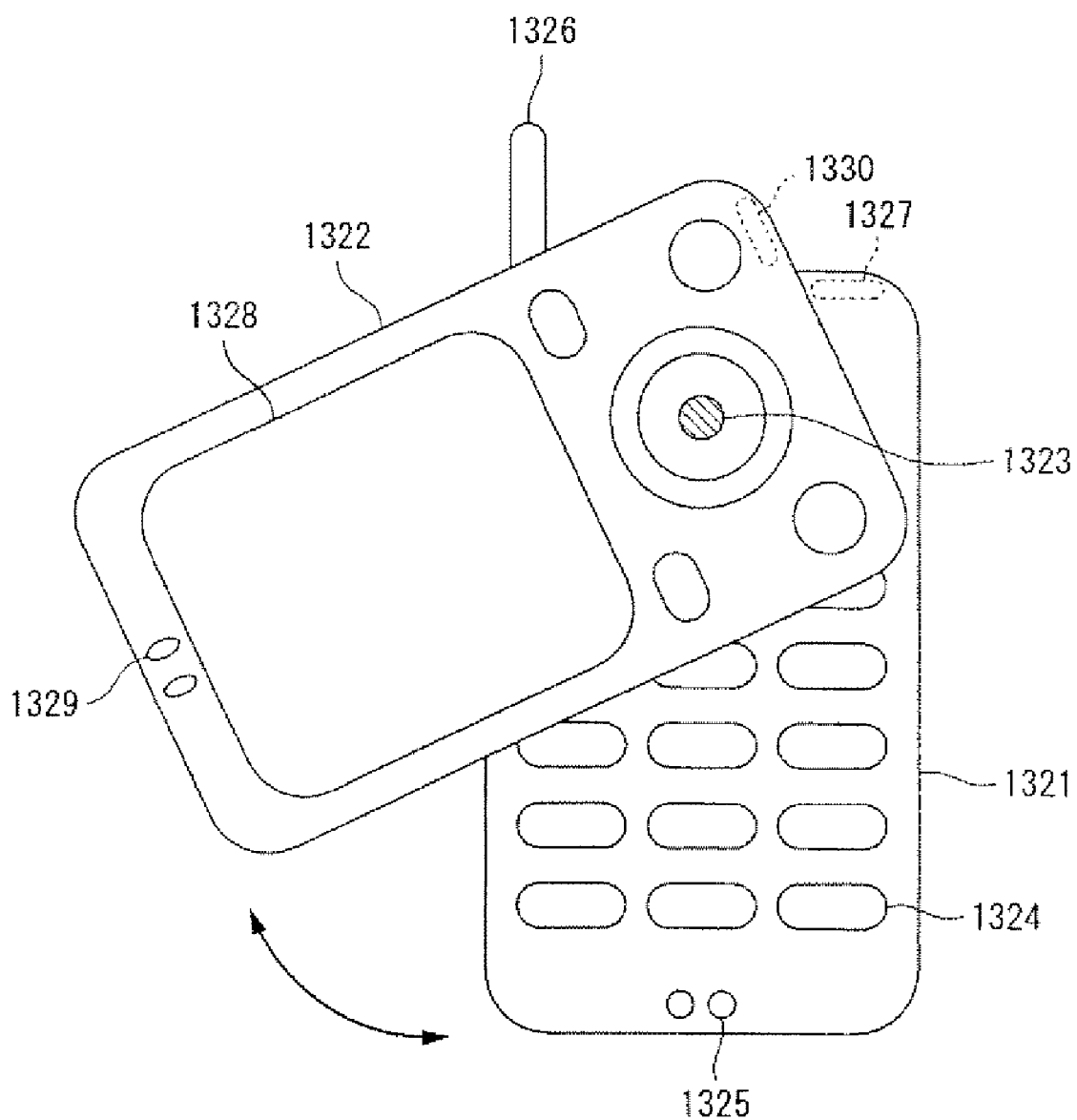
FIG. 13 shows an example in which the wireless communication described in conjunction with FIG. 11 is applied to a rotary cellular phone.

FIG. 13 illustrates an example in which the wireless communication described in conjunction with FIG. 11 is applied to the rotary cellular phone. In FIG. 13, operating buttons 1324 are arranged on a surface of a first housing 1321 and a microphone 1325 is provided at a lower end of the first housing 1321, and an external wireless communication antenna 1326 are provided at an upper end of the first housing 1321. A display member 1328 is provided on a surface of a second housing 1322 and a speaker 1329 is provided at an upper end of the second housing 1322.

An internal wireless communication antenna 1327 is provided in the first housing 1321, and the internal wireless communication antenna 1330 is provided in the second housing 1322 respectively, so that the internal wireless communication is performed between the first housing 1321 and the second housing 1322, The first housing 1321 and the second housing 1322 are connected via a hinge 1323 as a connecting mechanism member, so that the second housing 1322 can be arranged so as to be superimposed on the first housing 1321 or the second housing 1322 can be shifted from the first housing 1321 by horizontally rotating the second housing 1322 about the hinge 1323 as a supporting point.

As described above, the operating buttons 1324 can be protected by the second housing 1322 by arranging the second housing 1322 so as to be superimposed on the first housing 1321, so that the operating buttons 1324 are prevented from being operated by mistake when the cellular phone is carried. When the second housing 1322 is rotated horizontally and the second housing 1322 is shifted from the first housing 1321, the operator can operate the operating buttons 1324 while viewing the display member 1328 or talk while using the speaker 1329 and the microphone 1325.

The cellular phone shown in FIG. 13 includes a configuration in which the internal wireless communication antenna 1327 is provided in the first housing 1321 and the internal wireless communication antenna 1330 is provided in the second housing 1322, respectively, so that the data is transmitted between the first housing 1321 and the second housing 1322 by the internal wireless communication using the internal wireless communication antennas 1327 and 1330.

In other words, in the cellular phone in FIG. 13, the internal wireless communication antenna 1327 corresponds to the sending antenna 1110 in the electronic device in FIG. 11, and the internal wireless transmission antenna 1330 corresponds to the receiving antenna 1111 in the electronic device in FIG. 11.

In the cellular phone in FIG. 13, a circuit portion which corresponds to the sender block 1112 including a circuit portion corresponding to the sender 1102 in the electronic device in FIG. 11 is provided on the side of the internal wireless communication antenna 1327 (on the side of the first housing 1321).

In the same manner, a circuit portion corresponding to the receiver block 1113 including a circuit portion corresponding to the receiver 1106 in the electronic device in FIG. 11 is provided on the side of the internal wireless communication antenna 1330 (on the side of the second housing 1322) of the cellular phone in FIG. 13.

As described above relating to the device in FIG. 11, the sending side and the receiving side are assumed for convenience, and the device configured to be capable of bidirectional communication is also applied to FIG. 13 as a matter of course.

In the configuration described above, for example, the image data or the sound data acquired in the first housing 1321 via the external wireless communication antenna 1326 can be sent to the second housing 1322 by the internal wireless communication using the internal wireless communication antennas 1327 and 1330 to display the image on the display member 1328 and output the sound from the speaker 1329.

As described above, it is not necessary to transmit data between the first housing 1321 and the second housing 1322 with a fixed line, and hence it is no longer necessary to pass the multi-pin flexible wiring board through the hinge 1323. Therefore, an increase in complexity of the structure of the hinge 1323 can be constrained, and hence the complication of the mounting process can be avoided, whereby an increase in cost can be constrained, and a reduction in size and thickness and an improvement of reliability of the cellular phone as well as an increase in screen size and in function of the cellular phone without impairing portability of the cellular phone are achieved.

The technology of the wireless communication as described above can be applied to, for example, a video camera, PDA (Personal Digital Assistance), a laptop personal computer, and so on.

Twelfth Embodiment

Figure 14:
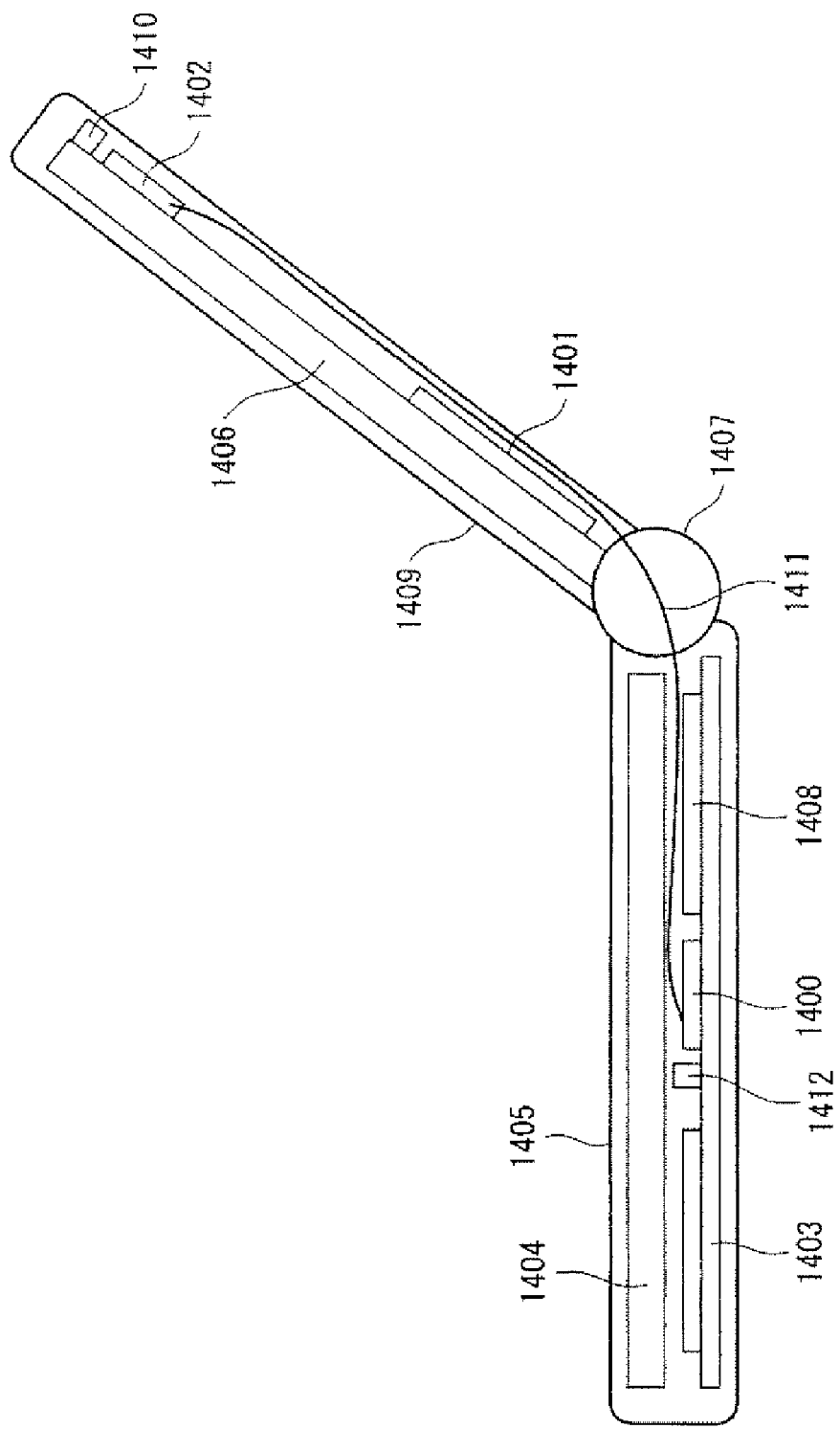
FIG. 14 shows an example in which the wireless communication described in conjunction with FIG. 11 is applied to a laptop personal computer.

FIG. 14 illustrates an example in which the wireless communication described in conjunction with FIG. 11 is applied to a laptop type personal computer. In FIG. 14, the laptop personal computer in this example is divided into a main body 1405 and a display unit 1409, which are unified via a hinge 1407 as a connecting mechanism member. The main body 1405 includes a main body substrate 1403 which is in charge of total function control, a keyboard 1404 as an input device and a liquid crystal controller 1408 for generating a display data by a control of an electronic circuit on the main body substrate 1403.

The display unit 1409 is provided with a liquid crystal display member 1406 as a display device. The main body 1405 and the display unit 1409 are provided respectively with a sending antenna 1412 and a receiving antenna 1410 for performing wireless communication with respect to each other. The main body 1405 and the display unit 1409 are connected by a line 1411 for performing wire communication or power supply with respect to each other. It is easy to transmit a low-speed signal through a fixed line and a simultaneous signal of the wireless communication unit can be transmitted. Accordingly, troublesome procedures or circuits, such as synchronous acquisition or tracking, are not necessary in the wireless communication unit, and hence the circuit can be simplified. In addition, it is also possible to send a cryptic key for enhancing security for communicating wirelessly while changing the key as needed.

In particular in the laptop personal computer, display data which is generated by the liquid crystal controller 1408 is converted into an electromagnetic wave (electric wave) by the sending antenna 1412 and is propagated in the air. The electromagnetic wave signal transmitted by the sending antenna 1412 is received by the receiving antenna 1410, and is sent to the liquid crystal driver 1401 via the receiver 1402, and is displayed on the liquid crystal display member 1406.

In the configuration described above, the sending antenna 1412 corresponds to the sending antenna 1110 in the electronic device in FIG. 11, and the receiving antenna 1410 corresponds to the receiving antenna 1111 in the electronic device in FIG. 11.

In the laptop personal computer in FIG. 14, a circuit portion corresponding to the sender block 1112 including a circuit portion corresponding to the sender 1102 in the electronic device in FIG. 11 is provided on the side of a sending antenna 1400 (on the side of the laptop personal computer main body 1405).

In the same manner, a circuit portion corresponding to the receiver block 1113 including the circuit portion corresponding to the receiver 1106 in the electronic device in FIG. 11 is provided on the side of the receiving antenna 1410 (on the side of the display unit 1409) of the laptop personal computer in FIG. 14.

As described above relating to the device in FIG. 11, the sending side and the receiving side are assumed for convenience, and the device configured to be capable of bidirectional communication is also applied to FIG. 14 as a matter of course.

In the above-described laptop personal computer, since information to be displayed on the liquid crystal display member 1406 as the display device is transmitted by the wireless communication between the main body 1405 and the display unit 1409, the number of signal lines which must be passed through the hinge 1407 can be reduced. Therefore, an increase in complexity of the structure can be constrained, and the complication of the mounting process can be avoided, whereby an improvement of reliability is achieved while constraining an increase in cost.

Although the embodiment has been described relating to the laptop personal computer thus far, the same technical idea can be applied also to a so-called mobile type computer which is smaller than the laptop type, the above-described PDA, and other handheld terminal devices as a mater of course.

Thirteenth Embodiment

The embodiment described in conjunction with FIG. 11 to FIG. 14 employs a configuration in which the signal is transmitted between the two housings each including the electronic circuit with the application of the pulse generating circuit described in conjunction with FIG. 1A to FIG. 10E and being connected by the mechanism member by the wireless communication.

However, the technical idea in the invention is not limited to such a mode in which the transmission of the signal between the two separate housings is achieved by the wireless communication.

In other words, a mode in which a sending circuit portion which corresponds to the sender block 1112 in FIG. 11 and a receiving circuit portion which corresponds to the receiver block are provided in the identical housing for achieving communication between both sending and receiving circuit portions with the application of the pulse generating circuit described in conjunction with FIG. 1A to FIG. 10E is also applicable. Subsequently, such an embodiment will be shown as an example and the technical idea of the invention will further be described.

Figure 15A:
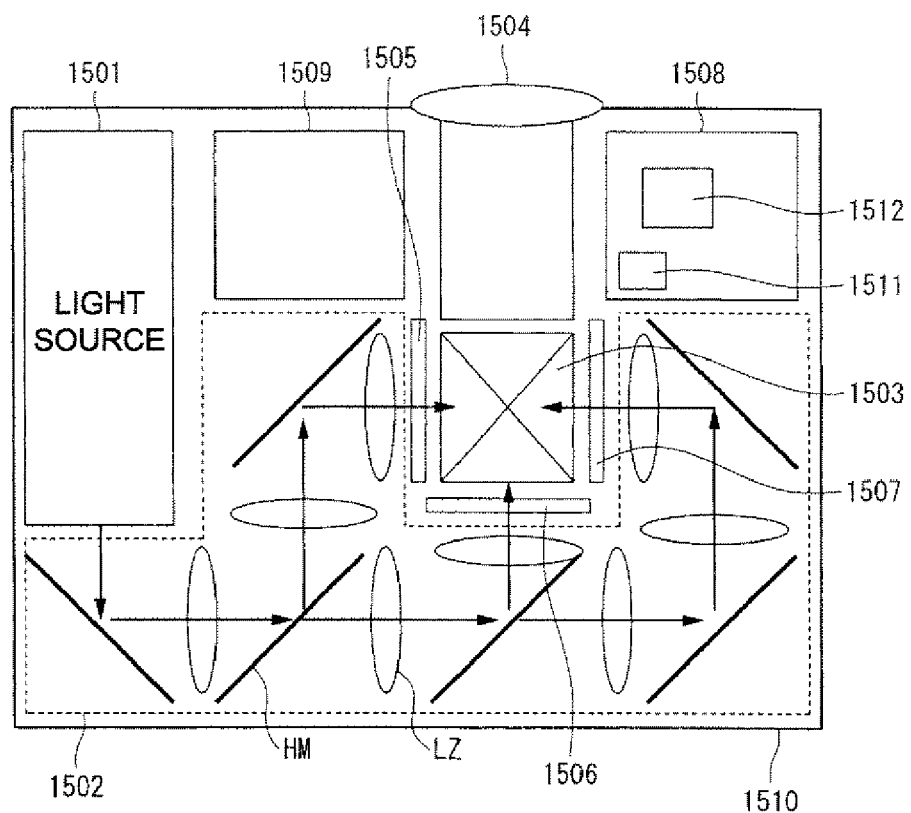
FIGS. 15A and 15B illustrate a configuration of a liquid crystal projector as an example of the electronic device according to the invention.
Figure 15B:
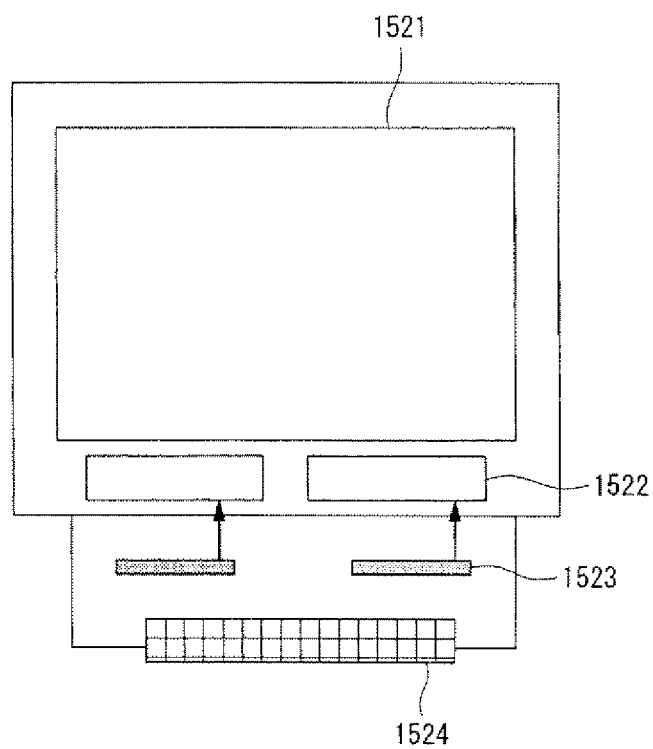

FIGS. 15A and 15B illustrate a configuration of a liquid crystal projector as one of the examples of the electronic device according to an aspect of the invention. FIG. 15A is a drawing showing a principal portion of the liquid crystal projector, and FIG. 15B is a drawing showing one of light valves in the liquid crystal projector in FIG. 15A in detail.

In FIG. 15A, in the projector, most of a housing 1510 is occupied by an optical system. In other words, a light beam (white light) emitted from the light source 1501 is decomposed into three primary colors by an optical system 1502 (in the broken line). The optical system 1502 here mainly includes a half mirror HM, an optical filter, and a lens LZ. The respective light beams are modulated by a light valve 1505, a light valve 1506, and a light valve 1507 via the liquid crystal, and then combined by an optical system 1503 composed of a prism, and is projected by an optical system 1504 in an enlarged scale.

Circuits for controlling the light valve 1505, the light valve 1506, and the light valve 1507 is mounted on substrates 1508, 1509. A modulator 1512 modulates a display data signal for controlling the light valve and emits the same from a sending antenna 1511 as an electromagnetic wave.

In FIG. 15B, a liquid crystal driver 1522 (normally includes a plurality of semiconductor integrated circuits) including a semiconductor integrated circuit for driving a light shutter 1521 by a transmission liquid crystal receives the display data signal sent from the sending antenna 1511 in FIG. 15A by the receiving antenna 1523, and drives the light shutter 1521 by a signal demodulated from the received signal.

On the other hand, the projector in this example is configured in such a manner that a power for driving the light shutter 1521 or the liquid crystal driver 1522 can be received via a connector 1524.

The display data signal of an electromagnetic wave sent by being multiplied from the sending antenna 1511 is assigned to a specific formal receiving circuit block (module) by a method using a sign diffusion, a method of using a modulation frequency of different electromagnetic wave, or a method of determining a time slot for addressing in order to separate these multiplied signals to enable the same to be received individually.

By employing the addressing method, the electromagnetic wave signal sent from the sending antenna 1511 is correctly transmitted to the specified light valve out of the three light valves. The address assignment may be made for each light valve, or it is also possible to assign the address to each of the plurality of liquid crystal drivers mounted on one light valve as shown in FIG. 15B.

As will be understood easily from the embodiment of the liquid crystal projector described in conjunction with FIG. 15A and FIG. 15B, the electronic device in this embodiment can be considered to have a configuration including a sending circuit portion provided with an electromagnetic wave converting unit for converting the sent signal to the electromagnetic wave signal and the sender for sending the electromagnetic wave signal wirelessly (in the device shown in FIGS. 15A and 15B, the modulator 1512 and the sending antenna 1511 or the like for modulating the display data signal for controlling the light valve and supplying the same to the sending antenna 1511 as the electromagnetic wave, which corresponds to the sender block 1112 in FIG. 11), and the receiving circuit portion provided with the receiver for receiving the electromagnetic wave signal and an electromagnetic wave restoring unit for restoring the received electromagnetic wave signal to the sending signal (in the device in FIGS. 15A and 15B, a receiving antenna 1523 and the circuit portion for demodulating the signal received by the receiving antenna 1523 to obtain a signal for driving the light shutter 1521, which corresponds to the receiver block in FIG. 11) stored in the identical housing.

It is clear that the technology described above includes at least a pair of wireless units for transmitting signals wirelessly mutually between those selected from a plurality of circuit blocks and circuit substrates mounted in the identical housing, and the corresponding wireless units are electronic devices configured with the application of any one of pulse generating circuits in the various modes described above.

In the configuration described above, the sending circuit portion and the receiving circuit portion can constitute a module as a circuit substrate or a circuit block.

In the electronic device of the configuration as described above, sending and receiving of the signal can be achieved wirelessly using the electromagnetic wave, and hence the signal is transmitted by propagation in the air. Therefore, wiring using a flexible substrate or a connector is not necessary, and hence anxiety such as an increase in cost or a lowering in reliability which may be caused thereby is eliminated.

Problems such as ending for impedance matching or increase in power consumption in association with an increase in speed of the data transmission can also be avoided. In addition, constraints such as layout of wiring and arrangement of parts are eliminated, so that the design or usability of the electronic device can be improved.

Since transmission of the signal is achieved over an extremely close distance such as within the identical housing, the electromagnetic wave used therefor must simply be capable of securing the communication within this distance, and hence the strength of the radiating electromagnetic wave can be minimized Therefore, the EMI characteristic is improved, and hence the electromagnetic wave can be managed easily.

In particular, in the case of the liquid crystal projector exemplified in conjunction with FIGS. 15A AND 15B, the majority of the volume of the housing is occupied by the optical system in the related art, and hence wiring that avoids the optical path or arrangement of parts that avoids the optical path are necessary and in addition, since heat generated from the light source is accumulated in the housing, a countermeasure for the heat of the wiring is also required. However, by the implementation of the invention, the signal is transmitted in the air by the electromagnetic wave, and hence these problems are remarkably alleviated.

The invention is very effective when it is applied to the UWB communication using short pulses.

What is claimed is:

1. A pulse generating circuit comprising:
   a plurality of serially-connected delay elements that receives an input trigger pulse;
   a plurality of logic elements that each communicate with at least one of the plurality of delay elements and that generate a first output pulse having a pulse width based in part on an output of the at least one of the plurality of delay elements; and
   a logic circuit that receives the first output pulses from the plurality of logic elements and generates a discontinuous pulse train that includes a second output pulse.

2. The pulse generating circuit of claim 1 wherein the pulse width of each of the first output pulses is based in part on a delay time between a rising point of an input and a drop point of the output of the at least one of the plurality of delay elements.

3. The pulse generating circuit of claim 1 wherein the plurality of delay elements includes a plurality of cascaded inverter circuits.

4. The pulse generating circuit of claim 1 wherein the plurality of logic elements includes at least one logical AND gate.

5. The pulse generating circuit of claim 1 wherein at least one of the plurality of delay elements and the plurality of logic elements includes a CMOS current mode logic circuit.

6. The pulse generating circuit of claim 1 further comprising:

a comparator circuit that compares a delay of the plurality of delay elements to a reference delay; and a control circuit that controls a delay of each of the plurality of delay elements based on an output of the comparator circuit.

7. The pulse generating circuit of claim 1 wherein each of the plurality of delay elements includes a CMOS inverter that receives a controlled current.

8. The pulse generating circuit of claim 1 wherein each of the plurality of delay elements includes a buffer circuit having a CMOS current mode logic circuit that receives a current and a delay of each of the plurality of delay elements is variably based on the current.

9. The pulse generating circuit of claim 1 further comprising:

an oscillation circuit having an oscillation frequency that includes at least one delay element; and a phase-locked loop that includes the oscillation circuit, that compares an output of the oscillation circuit to a reference frequency, and controls a delay of the delay element based on the comparison, wherein a delay of at least one of the plurality of delay elements is based on the comparison.

10. The pulse generating circuit of claim 1 further comprising:

a switching unit that connects an output of at least one of the plurality of delay elements to an input of the plurality of delay elements to form a ring oscillation circuit; and a phase-locked loop that includes the ring oscillation circuit, wherein:

the pulse generating circuit locks the phase-locked loop to a reference frequency and generates a control signal that determines a delay of the at least one of the plurality of delay elements; and the delay of the at least one of the plurality of delay elements is determined when the phase-locked loop is locked.

11. A cellular telephone comprising the pulse generating circuit of claim 1.

12. A personal computer comprising the pulse generating circuit of claim 1.

13. A pulse generating circuit comprising:

a delay circuit cascaded in N+1 stages each including a respective delay element; and a switching unit that connects to a first potential level when an output of an $i^{th}$ stage of the delay circuit ANDed with an output of an $i+1^{th}$ stage of the delay circuit is true, that connects to a second potential level when an output of the $i+1^{th}$ stage of the delay circuit ANDed with an output of an $i+2^{th}$ stage of the delay circuit is true, and that connects to a third potential level when neither of the outputs is true, wherein N is a positive odd integer and $1 \leq i \leq N-1$.

14. The pulse generating circuit of claim 13 wherein each of the N+1 stages includes at least one MOS inverter and a unit that controls a source current of the MOS inverter and a delay of the delay circuit is based on the source current.

15. A pulse generating method comprising:

receiving an input trigger pulse at a plurality of serially-connected delay elements;

generating first output pulses having a pulse width based in part on an output of at least one of the plurality of delay elements at a plurality of logic elements;

receiving the first output pulses from the plurality of logic elements at a logic circuit; and generating a discontinuous pulse train that includes a second output pulse at the logic circuit.

16. The method of claim 15 wherein the pulse width of each of the first output pulses is based in part on a delay time between a rising point of an input and a drop point of the output of the at least one of the plurality of delay elements.

17. The method of claim 15 wherein the plurality of delay elements includes a plurality of cascaded inverter circuits.

18. The method of claim 15 wherein the plurality of logic elements includes at least one logical AND gate.

19. The method of claim 15 wherein at least one of the plurality of delay elements and the plurality of logic elements includes a CMOS current mode logic circuit.

20. The method of claim 15 further comprising:

comparing a delay of the plurality of delay elements to a reference delay; and controlling a delay of each of the plurality of delay elements based on the comparison.

21. The method of claim 15 wherein each of the plurality of delay elements includes a CMOS inverter that receives a controlled current.

22. The method of claim 15 wherein each of the plurality of delay elements includes a buffer circuit having a CMOS current mode logic circuit that receives a current and a delay of each of the plurality of delay elements is variably based on the current.

23. The method of claim 15 further comprising:

generating an oscillation frequency at an oscillation circuit that includes at least one delay element; and comparing an output of the oscillation circuit to a reference frequency at a phase-locked loop; and controlling a delay of the delay element of the oscillation circuit based on the comparison, wherein a delay of at least one of the plurality of delay elements is based on the comparison.

24. The method of claim 15 further comprising:

connecting an output of at least one of the plurality of delay elements to an input of the plurality of delay elements to form a ring oscillation circuit;

locking a phase-locked loop to a reference frequency;

generating a control signal that determines a delay of the at least one of the plurality of delay elements; and determining the delay of the at least one of the plurality of delay elements when the phase-locked loop is locked.

25. A pulse generating circuit comprising:

a plurality of serially-connected delay elements form a ring oscillator and oscillate at a first frequency;

a plurality of logic elements that each communicate with at least one of the plurality of delay elements and that generate a first output pulse having a pulse width based in part on an output of the at least one of the plurality of delay elements; and a logic circuit that receives the first output pulses from the plurality of logic elements and generates a second output pulse having a second frequency that is greater than the first frequency.

* * * * *